(12) United States Patent
Yang et al.

(10) Patent No.: US 12,389,649 B2
(45) Date of Patent: Aug. 12, 2025

(54) TRANSISTORS WITH STACKED SEMICONDUCTOR LAYERS AS CHANNELS

(71) Applicant: Taiwan Semiconductor Manufacturing Co., Ltd., Hsinchu (TW)

(72) Inventors: Tsung-Hsi Yang, Zhubei (TW); Ming-Hua Yu, Hsinchu (TW); Jeng-Wei Yu, New Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 796 days.

(21) Appl. No.: 17/651,858

(22) Filed: Feb. 21, 2022

(65) Prior Publication Data

US 2022/0181440 A1    Jun. 9, 2022

Related U.S. Application Data

(62) Division of application No. 16/542,523, filed on Aug. 16, 2019, now Pat. No. 11,257,908.

(Continued)

(51) Int. Cl.
*H10D 62/17* (2025.01)
*H10D 30/01* (2025.01)
(Continued)

(52) U.S. Cl.
CPC ......... *H10D 62/314* (2025.01); *H10D 30/024* (2025.01); *H10D 30/62* (2025.01); *H10D 62/151* (2025.01); *H10D 62/834* (2025.01)

(58) Field of Classification Search
CPC .... H10D 62/314; H10D 30/024; H10D 30/62; H10D 62/151; H10D 62/834; H10D 30/797; H10D 64/017; H10D 30/0212; H10D 62/822; H10D 84/0158; H10D 84/038; H10D 62/292; H10D 30/611; H10D 30/795; H10D 30/798; H10D 62/60; H10D 64/513; H10D 30/6215; H01L 21/311
See application file for complete search history.

(56) References Cited

U.S. PATENT DOCUMENTS 9,548,362 B2    1/2017  Ching et al.
11,037,832 B2   6/2021  Ando et al.
(Continued)

FOREIGN PATENT DOCUMENTS

KR    20060028575 A    3/2006
KR    20150022905 A    3/2015
(Continued)

*Primary Examiner* — John P. Dulka
(74) *Attorney, Agent, or Firm* — Slater Matsil, LLP

(57) ABSTRACT

A method of forming a semiconductor device includes depositing a p-type semiconductor layer over a portion of a semiconductor substrate, depositing a semiconductor layer over the p-type semiconductor layer, wherein the semiconductor layer is free from p-type impurities, forming a gate stack directly over a first portion of the semiconductor layer, and etching a second portion of the semiconductor layer to form a trench extending into the semiconductor layer. At least a surface of the p-type semiconductor layer is exposed to the trench. A source/drain region is formed in the trench. The source/drain region is of n-type.

20 Claims, 19 Drawing Sheets

Related U.S. Application Data

(60) Provisional application No. 62/751,094, filed on Oct. 26, 2018.

(51) Int. Cl.
  *H10D 30/62* (2025.01)
  *H10D 62/13* (2025.01)
  *H10D 62/834* (2025.01)

(56) References Cited

U.S. PATENT DOCUMENTS

| | | |
|---|---|---|
| 11,121,138 B1 | 9/2021 | Chiu et al. |
| 11,289,494 B2 | 3/2022 | Ching et al. |
| 2006/0076625 A1 | 4/2006 | Lee et al. |
| 2009/0321849 A1* | 12/2009 | Miyamura ......... H10D 84/0128 257/E27.061 |
| 2013/0161756 A1 | 6/2013 | Glass et al. |
| 2014/0084351 A1* | 3/2014 | Huang ............... H10D 84/0158 438/513 |
| 2014/0312432 A1 | 10/2014 | Ching et al. |
| 2017/0186839 A1 | 6/2017 | Afzalian |
| 2019/0237464 A1 | 8/2019 | Ching et al. |
| 2020/0006389 A1 | 1/2020 | Huang et al. |
| 2021/0091179 A1 | 3/2021 | Wang et al. |
| 2021/0098583 A1 | 4/2021 | Tsai et al. |
| 2021/0202534 A1 | 7/2021 | Lin et al. |
| 2021/0273098 A1 | 9/2021 | Chang et al. |
| 2021/0305393 A1 | 9/2021 | Wang |
| 2021/0313223 A1 | 10/2021 | Huang et al. |
| 2022/0399459 A1* | 12/2022 | Liu ..................... H10D 30/751 |

FOREIGN PATENT DOCUMENTS

| | | |
|---|---|---|
| KR | 20150123691 A | 11/2015 |
| KR | 20160042736 A | 4/2016 |
| WO | 2014018201 A1 | 1/2014 |

\* cited by examiner

TRANSISTORS WITH STACKED SEMICONDUCTOR LAYERS AS CHANNELS

PRIORITY CLAIM AND CROSS-REFERENCE

This application is a divisional of U.S. patent application Ser. No. 16/542,523, entitled "Transistors with Stacked Semiconductor Layers as Channels," and filed Aug. 16, 2019, which claims the benefit of the U.S. Patent Provisional Application No. 62/751,094, entitled "Transistors with Stacked Semiconductor Layers as Channels," and filed Oct. 26, 2018, which applications are hereby incorporated herein by reference.

BACKGROUND

With the advancement of the integrated circuits, the density of the integrated circuit devices such as transistors is becoming increasingly higher, and the devices are becoming increasingly smaller. This provides a more demanding requirement to the performance of the integrated circuit devices. For example, the leakage currents need to be smaller, and the drive currents need to be higher.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
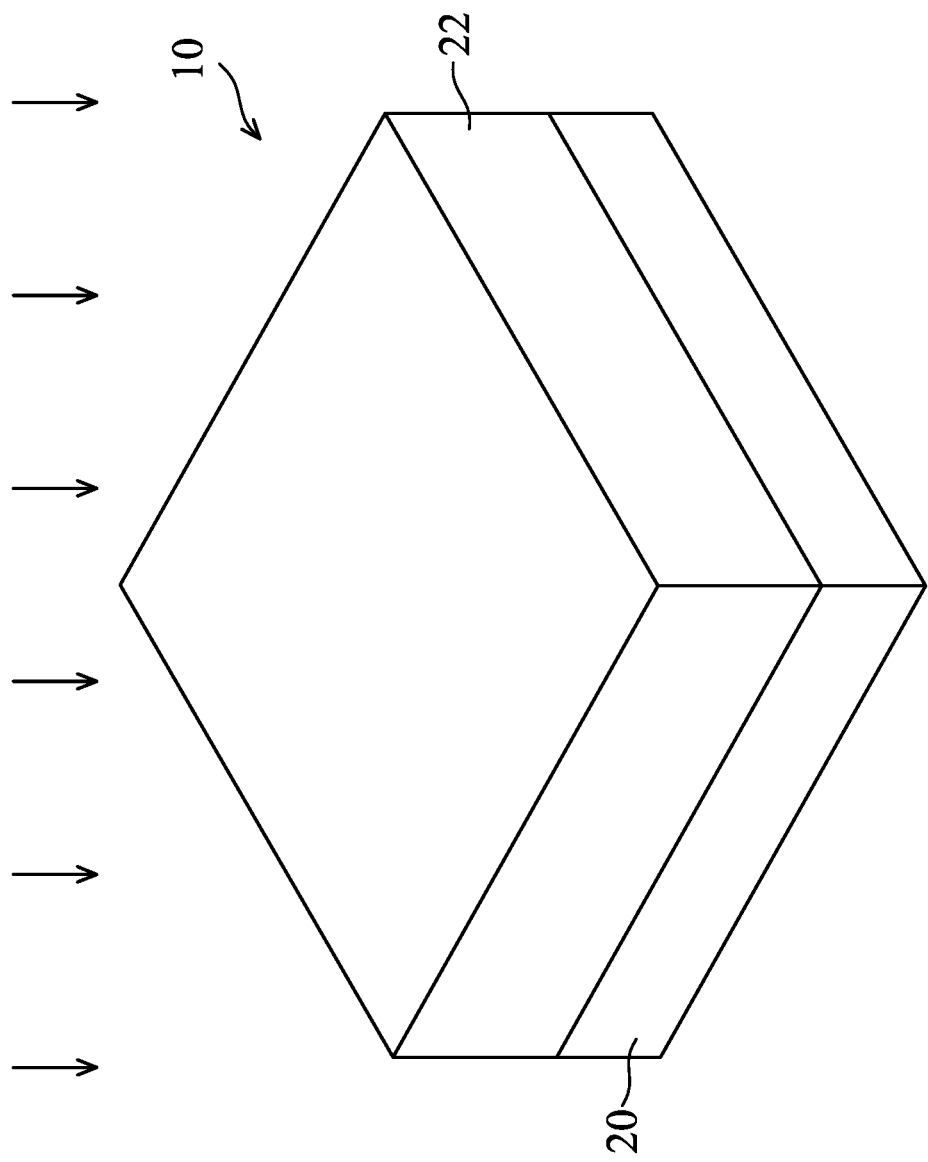
FIGS. 1-3, 4A, 4B, 5A, 5B, 6A, 6B, 7A, 7B, 8, 9, 10A, 10B, 11, 12A, and 12B illustrate the perspective views and cross-sectional views in the formation of transistors in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A transistor and the method of forming the same are provided in accordance with various embodiments. The intermediate stages in the formation of the transistor are illustrated in accordance with some embodiments. Some variations of some embodiments are discussed. Throughout the various views and illustrative embodiments, like reference numbers are used to designate like elements. In accordance with some embodiments of the present disclosure, a transistor include stacked silicon layer(s) and p-type semiconductor layers (such as silicon boron (SiB) layer(s)), which are used to form the channel region of the corresponding transistor, so that the leakage between source region and drain region is reduced. It is appreciated that the formation of a Fin Field-Effect Transistor is used as an example to explain the concept of the present disclosure. The embodiments of the present disclosure are readily applicable to other types of transistors such as planar transistors, Gate-All-Around (GAA) transistors, and the like. Also, it is appreciated that although n-type transistors are discussed in the examples of the embodiments, p-type transistors may also be formed by applying the concepts of the present disclosure. The p-type transistors may be similar to the n-type transistors, except that the p-type semiconductor layers in the stacked semiconductor layers of the n-type transistors are replaced with n-type semiconductor layers, the p-well region is replaced with an n-well region, and n-type source/drain regions are replaced with p-type source/drain regions.

FIGS. 1 through 3, 4A, 4B, 5A, 5B, 6A, 6B, 7A, 7B, 8, 9, 10A, 10B, 11, 12A, and 12B illustrate the perspective views and cross-sectional views in the formation of n-type transistors in accordance with some embodiments. The corresponding processes are also reflected schematically in the process flow 200 as shown in FIG. 13.

In FIG. 1, substrate 20 is provided. The substrate 20 may be a semiconductor substrate, such as a bulk semiconductor substrate, a Semiconductor-On-Insulator (SOI) substrate, or the like, which may be doped (e.g., with a p-type or an n-type dopant) or undoped. The semiconductor substrate 20 may be a part of wafer 10, such as a silicon wafer. Generally, an SOI substrate is a layer of a semiconductor material formed on an insulator layer. The insulator layer may be, for example, a Buried Oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of semiconductor substrate 20 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Further referring to FIG. 1, well region 22 is formed in substrate 20. The respective process is illustrated as process 202 in the process flow 200 shown in FIG. 13. In accordance with some embodiments of the present disclosure, well region 22 is a p-type well region formed through implanting a p-type impurity, which may be boron, indium, or the like. The resulting well region 22 may extend to the top surface of substrate 20. The p-type impurity concentration may be equal to or less than $10^{18}$ cm$^{-3}$, such as in the range between about $10^{17}$ cm$^{-3}$ and about $10^{18}$ cm$^{-3}$.

Figure 2:
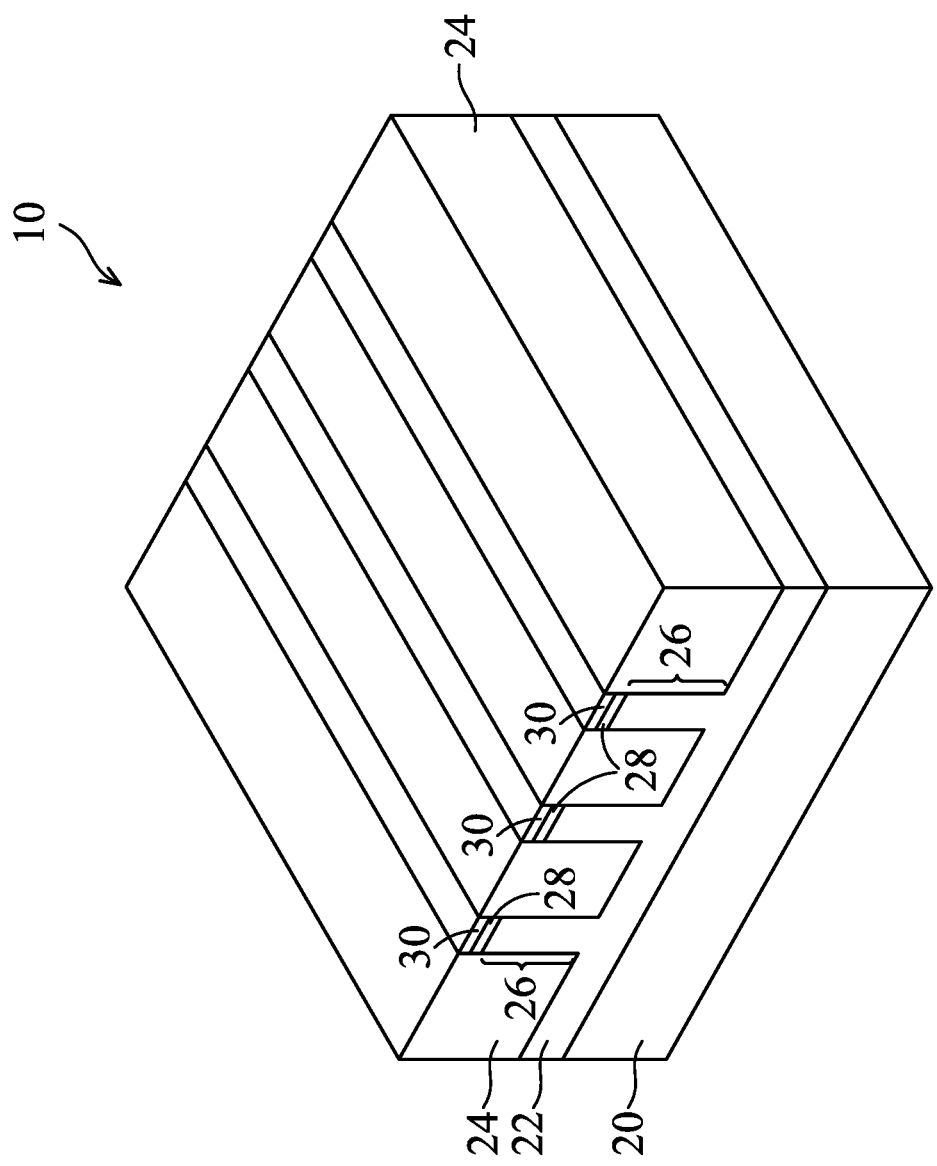

Referring to FIG. 2, isolation regions 24 are formed to extend from a top surface of substrate 20 into substrate 20. Isolation regions 24 are alternatively referred to as Shallow Trench Isolation (STI) regions hereinafter. The respective process is illustrated as process 204 in the process flow shown in FIG. 13. The portions of substrate 20 between neighboring STI regions 24 are referred to as semiconductor strips 26. To form STI regions 24, pad oxide layer 28 and hard mask layer 30 are formed on semiconductor substrate 20, and are then patterned. Pad oxide layer 28 may be a thin film including silicon oxide. In accordance with some embodiments of the present disclosure, pad oxide layer 28 is formed in a thermal oxidation process, wherein a top surface layer of semiconductor substrate 20 is oxidized. Pad oxide layer 28 acts as an adhesion layer between semiconductor substrate 20 and hard mask layer 30. Pad oxide layer 28 may also act as an etch stop layer for etching hard mask layer 30. In accordance with some embodiments of the present disclosure, hard mask layer 30 is formed of silicon nitride, for example, using Low-Pressure Chemical Vapor Deposition (LPCVD). In accordance with other embodiments of the present disclosure, hard mask layer 30 is formed by thermal nitridation of silicon, or Plasma Enhanced Chemical Vapor Deposition (PECVD). A photo resist (not shown) is formed on hard mask layer 30 and is then patterned. Hard mask layer 30 is then patterned using the patterned photo resist as an etching mask to form hard masks 30 as shown in FIG. 2.

Next, the patterned hard mask layer 30 is used as an etching mask to etch pad oxide layer 28 and substrate 20, followed by filling the resulting trenches in substrate 20 with a dielectric material(s). A planarization process such as a Chemical Mechanical Polish (CMP) process or a mechanical grinding process is performed to remove excessing portions of the dielectric materials, and the remaining portions of the dielectric materials(s) are STI regions 24. STI regions 24 may include a liner dielectric (not shown), which may be a thermal oxide formed through thermal oxidation of a surface layer of substrate 20. The liner dielectric may also be a deposited silicon oxide layer, silicon nitride layer, or the like formed using, for example, Atomic Layer Deposition (ALD), High-Density Plasma Chemical Vapor Deposition (HDPCVD), or Chemical Vapor Deposition (CVD). STI regions 24 may also include a dielectric material over the liner oxide, wherein the dielectric material may be formed using Flowable Chemical Vapor Deposition (FCVD), spin-on coating, or the like. The dielectric material over the liner dielectric may include silicon oxide in accordance with some embodiments.

In accordance with some embodiments of the present disclosure, the bottoms of well region 22 is lower than the bottom surfaces of STI regions 24, and hence semiconductor strips 26 are parts of well region 22, and are doped with the p-type impurity for forming well region 22.

Figure 3:
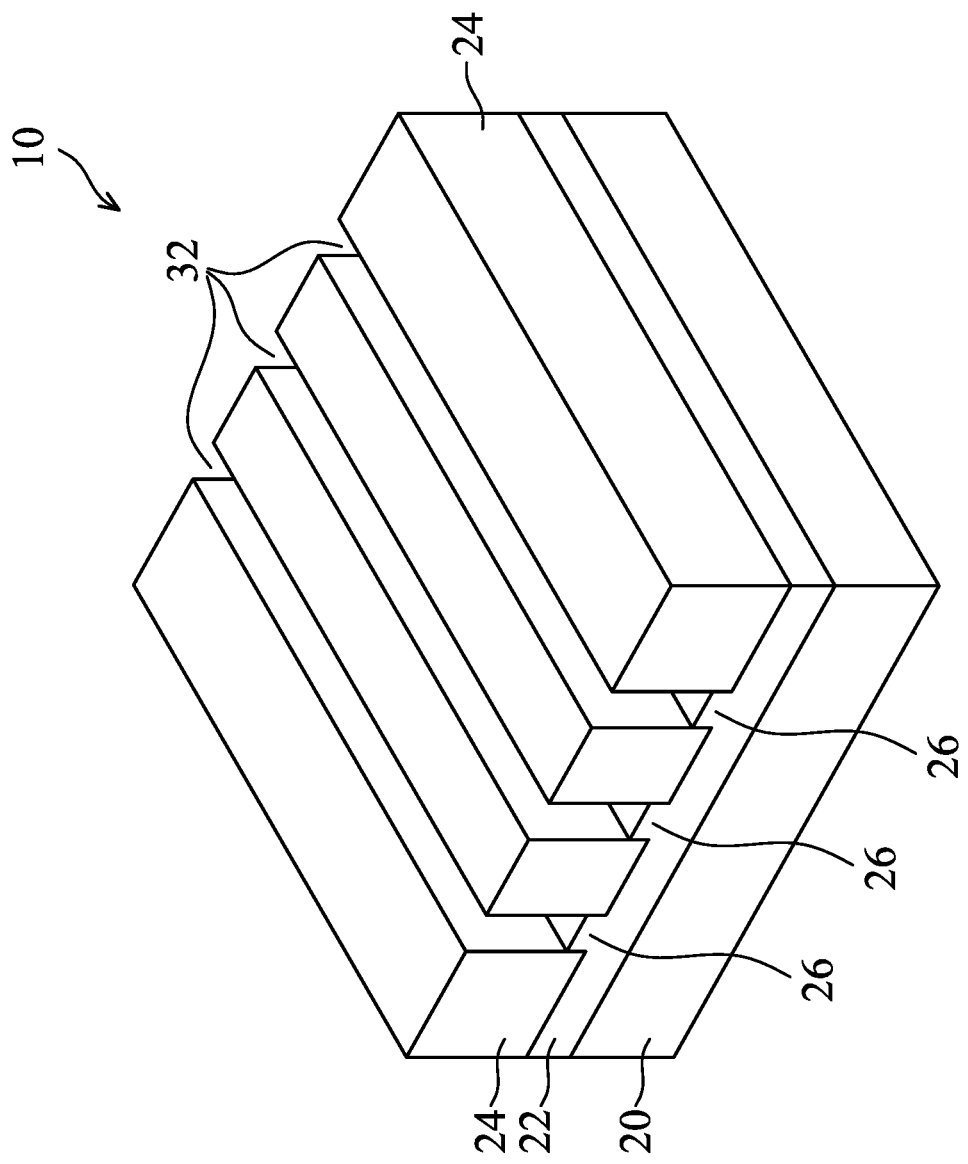

In a subsequent process, pad oxide layer 28 and hard mask layer 30 are removed. Next, as shown in FIG. 3, semiconductor strips 26 are recessed, so that trenches 32 are formed between neighboring STI regions 24. The respective process is illustrated as process 206 in the process flow shown in FIG. 13. In accordance with some embodiments of the present disclosure, the recessing is performed through dry etch. The dry etch may be performed using an etching gas selected from $C_2F_6$, $CF_4$, $SO_2$, the mixture of HBr, $Cl_2$, and $O_2$, or the mixture of HBr, $Cl_2$, $O_2$, and $CF_2$ etc., or the like. In accordance with alternative embodiments, the etching is performed using a wet etching method, in which KOH, tetramethylammonium hydroxide (TMAH), $CH_3COOH$, $NH_4OH$, $H_2O_2$, Isopropanol (IPA), the solution of HF, $HNO_3$, and $H_2O$, or the like, is used as the etchant. In accordance with some embodiments, the bottoms of trenches 32 are higher than the bottom surfaces of STI regions 24.

Figure 4A:
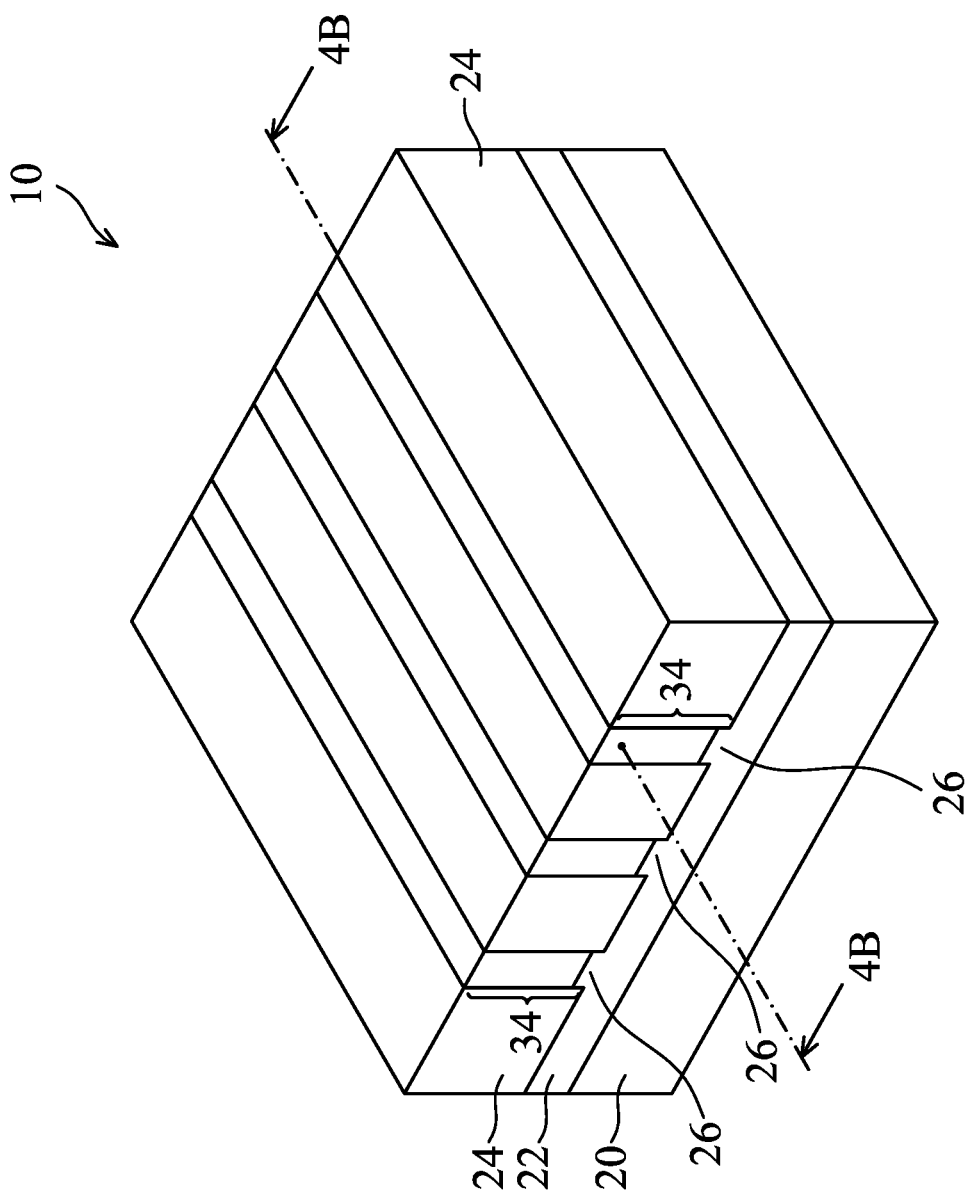

FIG. 4A illustrates the formation of stacked semiconductor layers 34 (with the details shown in FIG. 4B), which are formed through Selective Epitaxial Growth (SEG). The stacked semiconductor layers 34 are formed in trenches 32 as shown in FIG. 3. The respective process is illustrated as process 208 in the process flow shown in FIG. 13. In accordance with some embodiments of the present disclosure, stacked semiconductor layers 34 include a plurality of stacked layers including at least two, and possibly more, silicon layers and at least one, and possibly more, p-type epitaxy layers (such as SiB layers), which are discussed in detail referring to FIG. 4B. The epitaxially grown semiconductor layers may be grown to a level higher than the top surfaces of STI regions 24. In a subsequent process, a planarization process such as a CMP process or a mechanical grinding process is performed to remove excess portions of the grown semiconductor materials, resulting in the structure shown in FIGS. 4A and 4B.

Figure 4B:
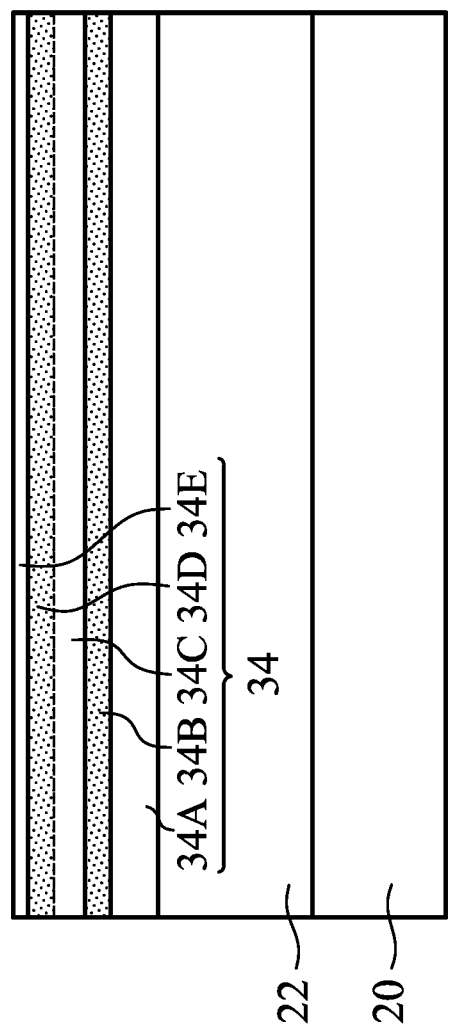

FIG. 4B illustrates the reference cross-section 4B-4B in FIG. 4A, except the details of stacked semiconductor layers 34 are illustrated. In accordance with some embodiments of the present disclosure, silicon layer 34A is epitaxially grown first. The thickness of silicon layer 34A may be in the range between about 1 nm and about 5 nm. In accordance with some embodiments of the present disclosure, silicon layer 34A is an intrinsic layer that is neither intentionally doped with any p-type impurity nor intentionally doped with any n-type impurity. In accordance with alternative embodiments of the present disclosure, silicon layer 34A is doped with a p-type impurity such as boron, indium, or the like, with an impurity concentration lower than the p-type impurity concentration of the overlying p-type semiconductor layer 34B by at least one order, two orders, or more. Accordingly, silicon layer 34A, if doped with a p-type impurity, may have an impurity concentration lower than about $10^{17}$ $cm^{-3}$, or lower than about $10^{16}$ $cm^{-3}$, or lower. In accordance with other embodiments, layer 34A may be formed of other semiconductor materials such as silicon germanium, silicon carbon, or the like, which may be intrinsic layers undoped with (or lightly doped with) any p-type or n-type impurities.

P-type epitaxy semiconductor layer 34B is epitaxially grown on silicon layer 34A. In accordance with some embodiments of the present disclosure, p-type semiconductor layer 34B comprises silicon and a p-type impurity such as boron, indium, or the like. For example, p-type semiconductor layer 34B may be a silicon boron (SiB) layer. The p-type impurity is in-situ doped with the proceeding of the epitaxy of p-type semiconductor layer 34B. The p-type impurity concentration in p-type semiconductor layer 34B cannot be too high since this may cause the p-type impurity to be undesirably diffused into the underlying silicon layer 34A and the overlying silicon layer 34C, which causes the leakage prevention ability to be undesirably compromised. For example, the p-type impurity concentration in p-type semiconductor layer 34B may be lower than about $5 \times 10^{20}$ $cm^{-3}$, or lower than about $1 \times 10^{19}$ $cm^{-3}$. The p-type impurity concentration in p-type semiconductor layer 34B also cannot be too low since the p-type impurity in in p-type semiconductor layer 34B generate holes, and if the p-type impurity concentration is too low, the number of the generated holes is too low, which again causes the leakage prevention ability to be undesirably compromised. For example, the p-type impurity concentration in p-type semiconductor layer 34B may be in the range between about $5\times10^{17}$ cm$^{-3}$ and about $5\times10^{20}$ cm$^{-3}$, and may be in the range between about $1\times10^{18}$ cm$^{-3}$ and about $1\times10^{19}$ cm$^{-3}$. In accordance with some embodiments, p-type semiconductor layer 34B is free from germanium, carbon, or the like. In accordance with alternative embodiments, p-type semiconductor layer 34B includes silicon and an element selected from germanium, carbon, or the like. The thickness of p-type semiconductor layer 34B may be in the range between about 1 nm and about 15 nm.

Over p-type semiconductor layer 34B, another silicon layer 34C is epitaxially grown. In accordance with some embodiments of the present disclosure, silicon layer 34C is an intrinsic layer that is neither intentionally doped with any p-type impurity nor intentionally doped with any n-type impurity. In accordance with alternative embodiments of the present disclosure, silicon layer 34C is doped with a p-type impurity such as boron, indium, or the like, with an impurity concentration lower than the p-type impurity concentration of the underlying p-type epitaxy semiconductor layer 34B by at least one order, two orders, or more. Accordingly, silicon layer 34C, if doped with a p-type impurity, may have an impurity concentration lower than about $10^{17}$ cm$^{-3}$, or lower than about $10^{16}$ cm$^{-3}$, or lower. Depending on whether there are additional epitaxy semiconductors layers 34D and 34E formed over silicon layer 34C or not, the thickness of silicon layer 34C may be in a large range between about 14 nm and about 51 nm.

In accordance with some embodiments of the present disclosure, the epitaxy process is finished after the formation of silicon layer 34C, and no additional semiconductor layer is epitaxially grown over silicon layer 34C. In accordance with alternative embodiments of the present disclosure, p-type epitaxy semiconductor layer 34D is further grown over silicon layer 34C, and no additional semiconductor layer is epitaxially grown over p-type epitaxy semiconductor layer 34D. In accordance with yet alternative embodiments of the present disclosure, p-type epitaxy semiconductor layer 34D is grown over silicon layer 34C, and silicon layer 34E is further grown over p-type epitaxy semiconductor layer 34D. Accordingly, p-type epitaxy semiconductor layer 34D and silicon layer 34E are illustrated using dashed lines to indicate that they may be, or may not be, formed.

P-type epitaxy semiconductor layer 34D (if formed) is epitaxially grown on silicon layer 34C. In accordance with some embodiments of the present disclosure, p-type epitaxy semiconductor layer 34D comprises silicon and a p-type impurity such as boron, indium, or the like. For example, p-type epitaxy semiconductor layer 34D may be a SiB layer. The p-type impurity is in-situ doped with the proceeding of the epitaxy of p-type epitaxy semiconductor layer 34D. Similarly, the p-type impurity concentration in p-type semiconductor layer 34D cannot be too high or too low. Otherwise, the electron-hole combining function of the p-type epitaxy semiconductor layer is compromised. In accordance with some embodiments of the present disclosure, the p-type impurity concentration in p-type epitaxy semiconductor layer 34D is in the range between about $5\times10^{17}$ cm$^{-3}$ and about $5\times10^{20}$ cm$^{-3}$, and may be in the range between about $1\times10^{18}$ cm$^{-3}$ and about $1\times10^{19}$ cm$^{-3}$. In accordance with some embodiments, p-type semiconductor layer 34B is free from germanium, carbon, or the like. The thickness of p-type epitaxy semiconductor layer 34D may be in the range between about 1 nm and about 15 nm.

Over p-type epitaxy semiconductor layer 34D, another silicon layer 34E may be epitaxially grown, or the formation of silicon layer 34E may be skipped. In accordance with some embodiments of the present disclosure, silicon layer 34E is an intrinsic layer that is neither intentionally doped with any p-type impurity nor intentionally doped with any n-type impurity. In accordance with alternative embodiments of the present disclosure, silicon layer 34E is doped with a p-type impurity such as boron, indium, or the like, with an impurity concentration lower than the p-type impurity concentration of the underlying p-type epitaxy semiconductor layers 34B and 34D by at least one order, two orders, or more. Accordingly, silicon layer 34E, if doped with a p-type impurity, may have an impurity concentration lower than about $10^{17}$ cm$^{-3}$, or lower than about $10^{16}$ cm$^{-3}$, or lower. Silicon layer 34E (if formed) may be used as a buffer layer to receive the planarization process (FIG. 4A), and to protect the underlying p-type epitaxy semiconductor layer 34D from receiving the planarization. The thickness of silicon layer 34E may be small, and may be controlled to be as small as possible, as long as it can protect p-type epitaxy semiconductor layer 34D from being planarized with adequate process margin. In accordance with some embodiments of the present disclosure, the thickness of silicon layer 34E is in the range between about 1 nm and about 5 nm.

Figure 5A:
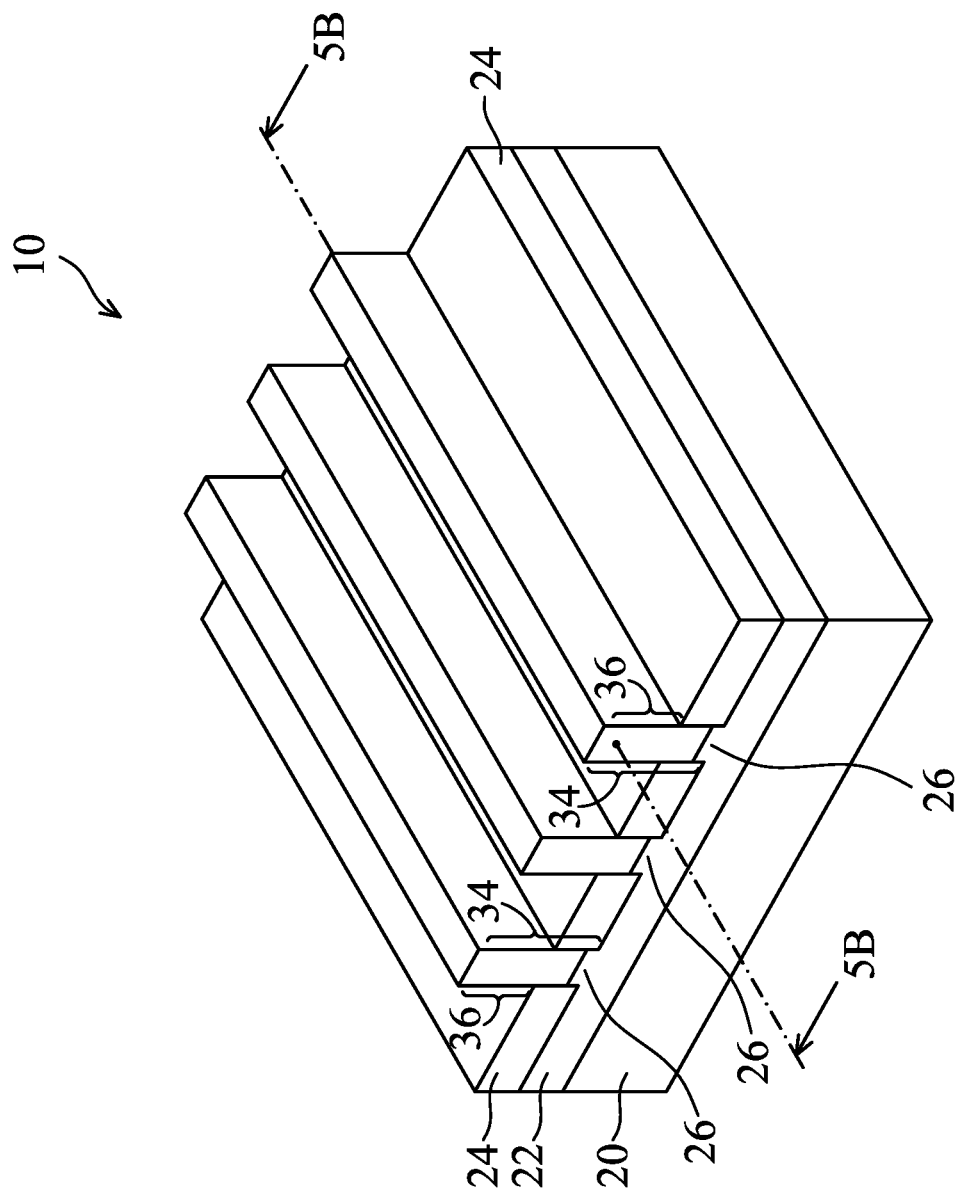

Next, referring to FIG. 5A, STI regions 24 are recessed such that at least the upper portions of stacked semiconductor layers 34 protrude higher than the top surfaces of neighboring STI regions 24. The respective process is illustrated as process 210 in the process flow shown in FIG. 13. Furthermore, STI regions 24 may have a flat surface as illustrated, a convex top surface, a concave top surface (such as dishing), or a combination thereof. The top surfaces of the STI regions 24 may be formed flat, convex, and/or concave by an appropriate etch. The STI regions 24 may be recessed using an acceptable etching process using an etchant that attacks STI regions 24, but does not attack semiconductor layers 34. For example, if wet etch is used, the etchant may include dilute hydrofluoric (dHF) acid. If dry etch is used, a mixture of NF$_3$ and NH$_3$ gases or a mixture of HF and NH$_3$ gases may be used. The portions of semiconductor material higher than the top surfaces of STI regions 24 are referred to as protruding fins 36.

Figure 5B:
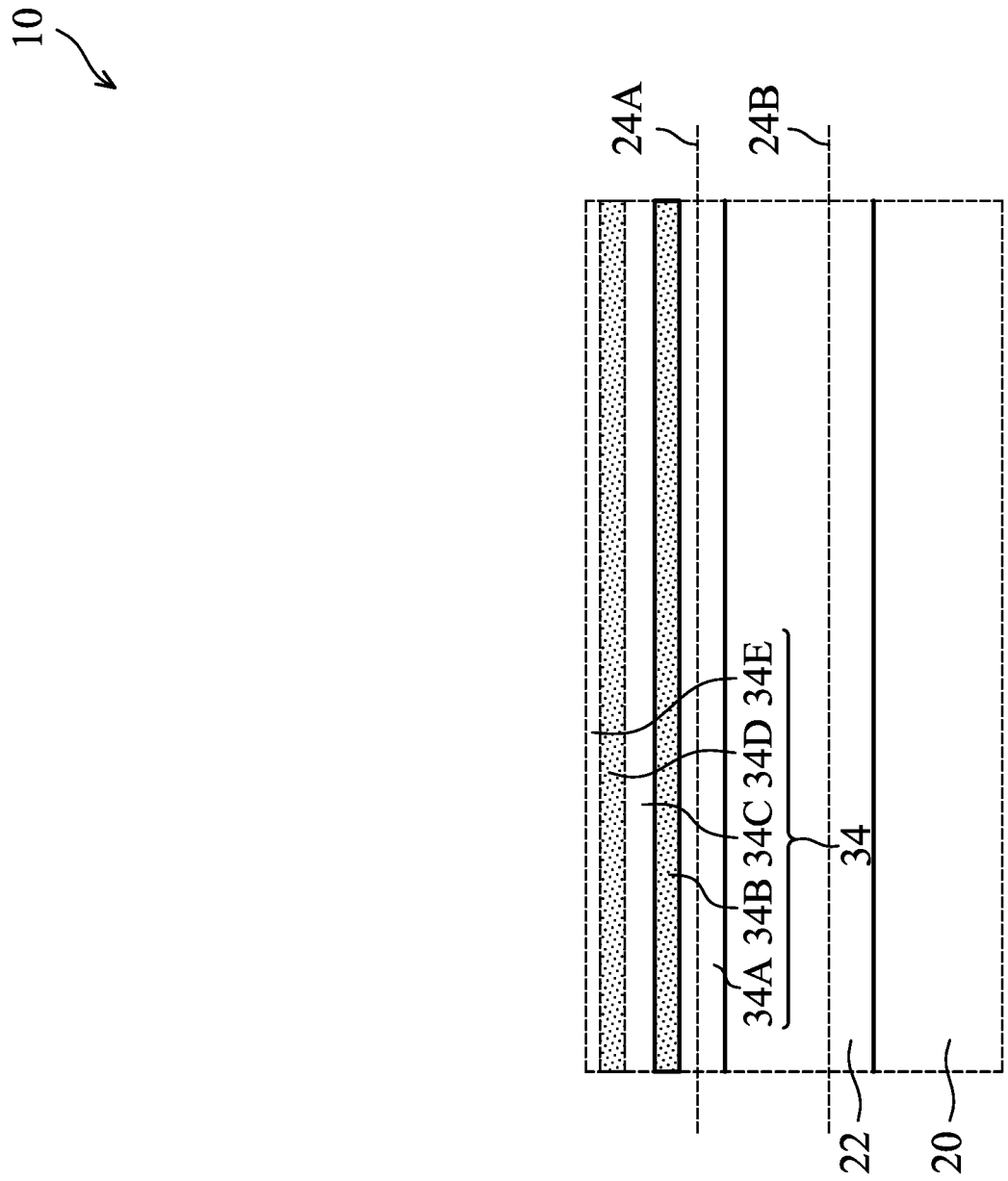

FIG. 5B illustrates the reference cross-section 5B-5B in FIG. 5A, except the details of stacked semiconductor layers 34 are illustrated. Since STI regions 24 are not in the illustrated plane, STI regions 24 are not shown in FIG. 5B. The levels of the top surfaces 24A and bottom surfaces 24B of STI regions 24 are illustrated to show the level of STI regions 24. In accordance with some embodiments of the present disclosure, the top surfaces 24A of STI regions 24 are at an intermediate level between the top surface and the bottom surface of silicon layer 34A. In accordance with alternative embodiments, the top surfaces 24A of STI regions 24 are level with the top surface of silicon layer 34A. The top surfaces 24A of STI regions 24 may also be level with or lower than the bottom surface of silicon layer 34A.

In above-illustrated embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

Figure 6A:
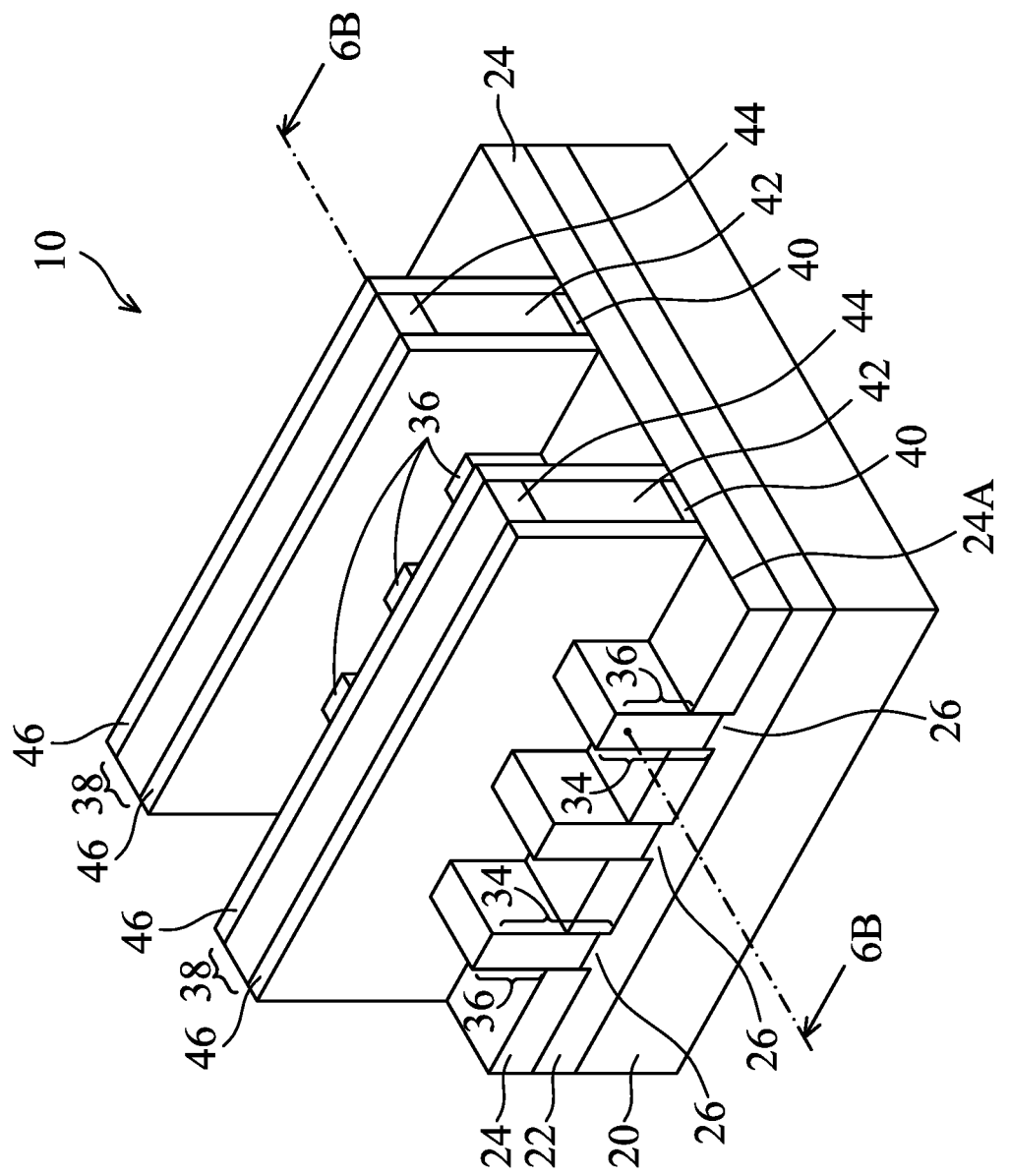

Referring to FIG. 6A, dummy gate stacks 38 are formed to extend on the top surfaces and the sidewalls of (protruding) fins 36. The respective process is illustrated as process 212 in the process flow shown in FIG. 13. Dummy gate stacks 38 may include dummy gate dielectrics 40 and dummy gate electrodes 42 over dummy gate dielectrics 40. Dummy gate electrodes 42 may be formed, for example, using polysilicon, and other materials may also be used. Each of dummy gate stacks 38 may also include one (or a plurality of) hard mask layer 44 over dummy gate electrodes 42. Hard mask layers 44 may be formed of silicon nitride, silicon oxide, silicon carbo-nitride, or multi-layers thereof. Dummy gate stacks 38 may cross over a single one or a plurality of protruding fins 36 and/or STI regions 24. Dummy gate stacks 38 also have lengthwise directions perpendicular to the lengthwise directions of protruding fins 36.

Figure 6B:
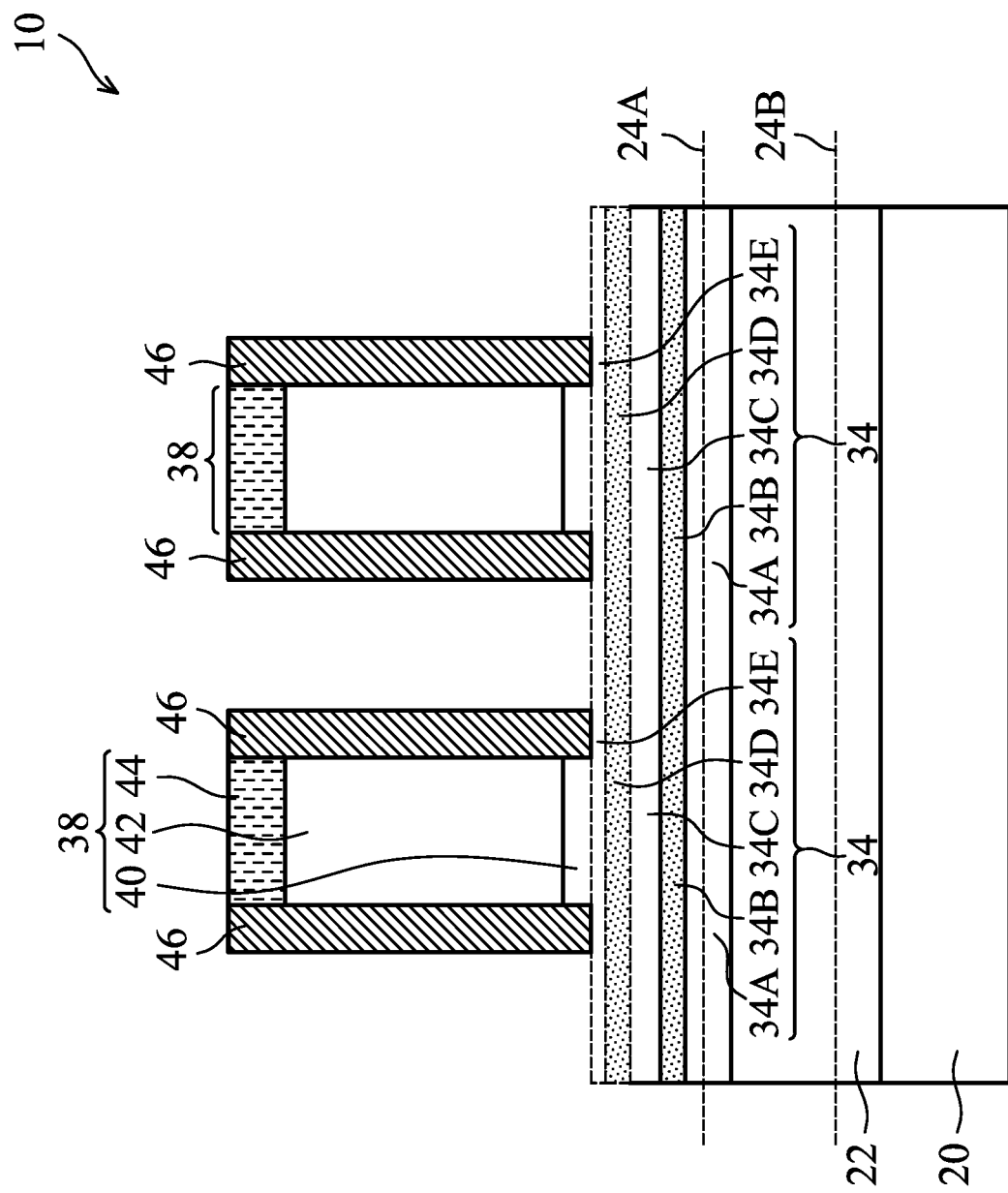

Next, gate spacers 46 are formed on the sidewalls of dummy gate stacks 38. The respective process is also illustrated as process 212 in the process flow shown in FIG. 13. In accordance with some embodiments of the present disclosure, gate spacers 46 are formed of a dielectric material(s) such as silicon nitride, silicon carbo-nitride, or the like, and may have a single-layer structure or a multi-layer structure including a plurality of dielectric layers. FIG. 6B illustrates the reference cross-section 6B-6B in FIG. 6A. It is appreciated that since layers 34D and 34E may or may not be formed, gate stack 38 may have a bottom surface contacting the top surface of silicon layer 34E, p-type epitaxy semiconductor layer 34D, or silicon layer 34C.

Figure 7A:
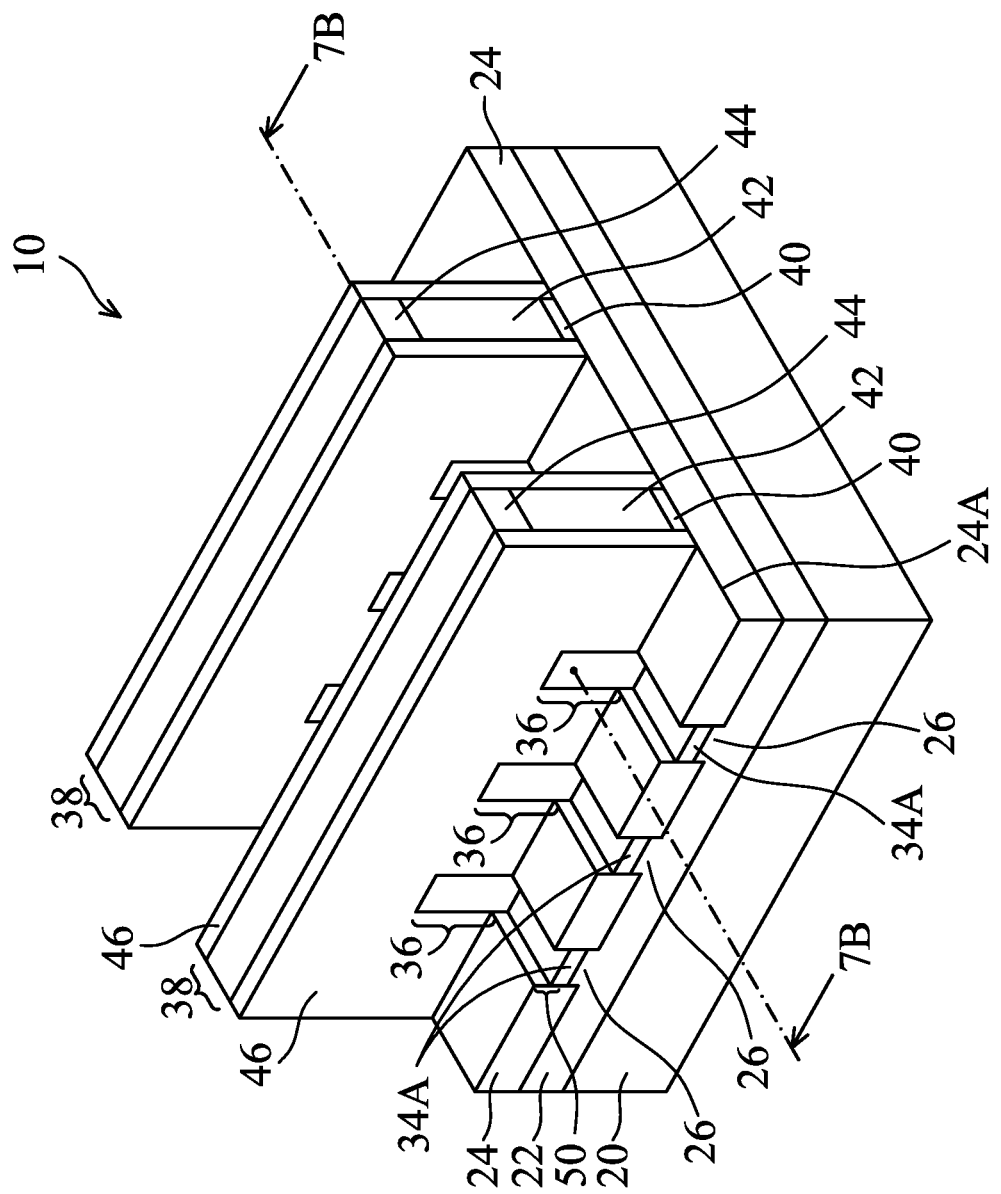

An etching step is then performed to recess the portions of stacked semiconductor layers 34 that are not covered by dummy gate stack 38 and gate spacers 46, resulting in the structure shown in FIG. 7A. The respective process is illustrated as process 214 in the process flow shown in FIG. 13. The recessing may be anisotropic, and hence the portions of fins 36 directly underlying dummy gate stacks 38 and gate spacers 46 are protected, and are not etched. The top surfaces of the recessed stacked semiconductor layers 34 may be lower than the top surfaces 24A of STI regions 24 in accordance with some embodiments. Recesses 50 are accordingly formed. Recesses 50 comprise portions located on the opposite sides of dummy gate stacks 38, and portions between remaining portions of protruding fins 36.

Figure 7B:
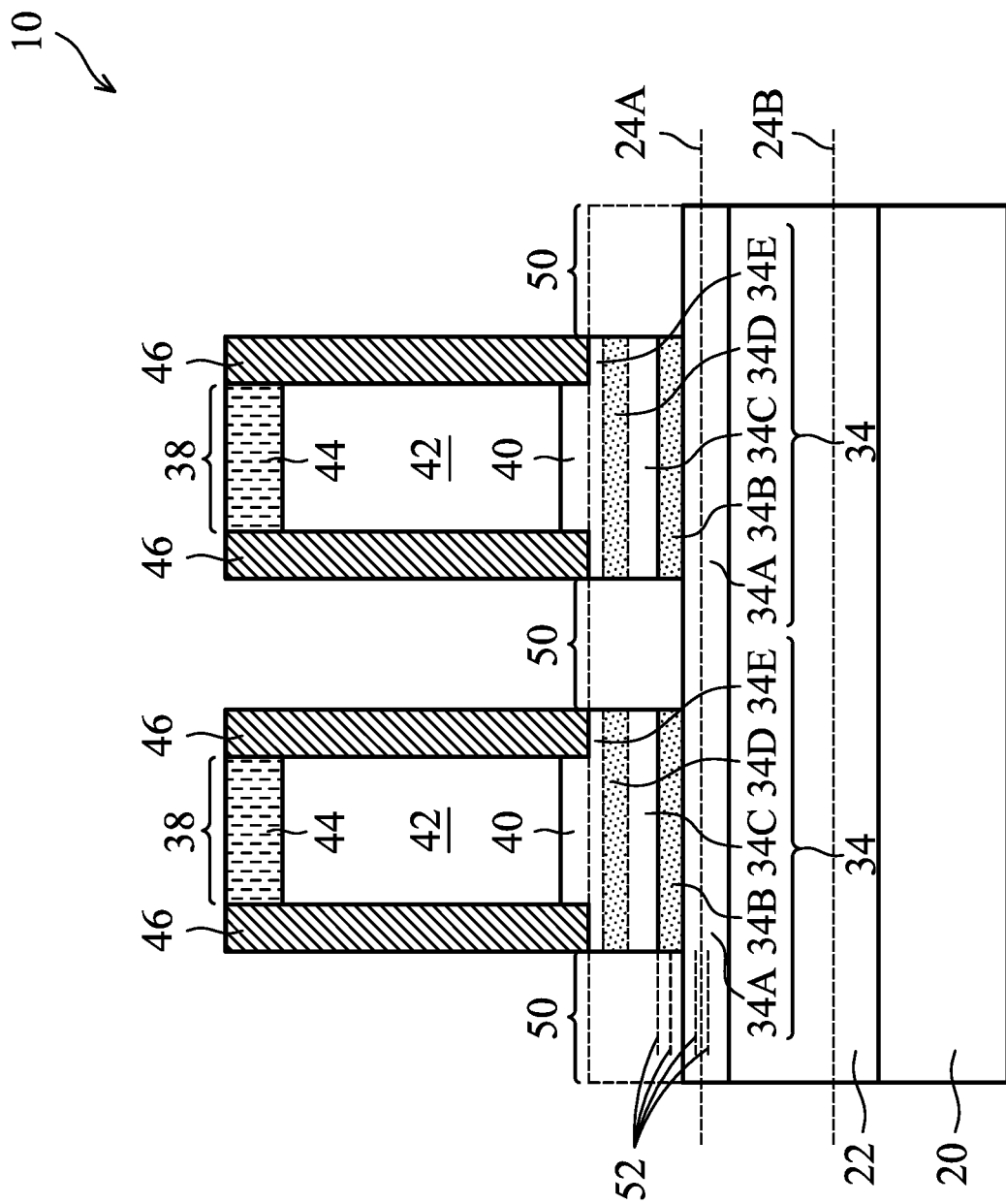

FIG. 7B illustrates the reference cross-section 7B-7B in FIG. 7A. In accordance with some embodiments of the present disclosure, the bottoms of recesses 50 are at the bottom surface level of p-type semiconductor layer 34B, and hence recesses 50 penetrate through p-type semiconductor layer 34B. The sidewalls of the remaining portions of p-type semiconductor layer 34B are exposed to recesses 50. In accordance with alternative embodiments, the bottoms of recesses 50 are at the top surface level of p-type epitaxy semiconductor layer 34B, and the top surface of p-type epitaxy semiconductor layer 34B are exposed. In accordance with yet alternative embodiments, the bottoms of recesses 50 are at a level between the top surface level and the bottom surface level of p-type epitaxy semiconductor layer 34B. Also, the bottom surfaces of recesses 50 may be at a level between the top surfaces and the bottom surfaces of STI regions 24. The bottom surfaces of recesses 50 may also be higher than or lower than the top surface of STI regions 24. Dashed lines 52 illustrate the likely positions of the bottom surfaces of recesses 50. It is preferred that recesses 50 does not penetrate through silicon layer 34A, so that the implanted well region 22 is not exposed to recesses 50, and the subsequently formed source/drain regions 54 (FIG. 8) is spaced apart the implanted well region 22, which has more defects than the epitaxy semiconductor layers 34 and hence may cause more junction leakage.

Figure 8:
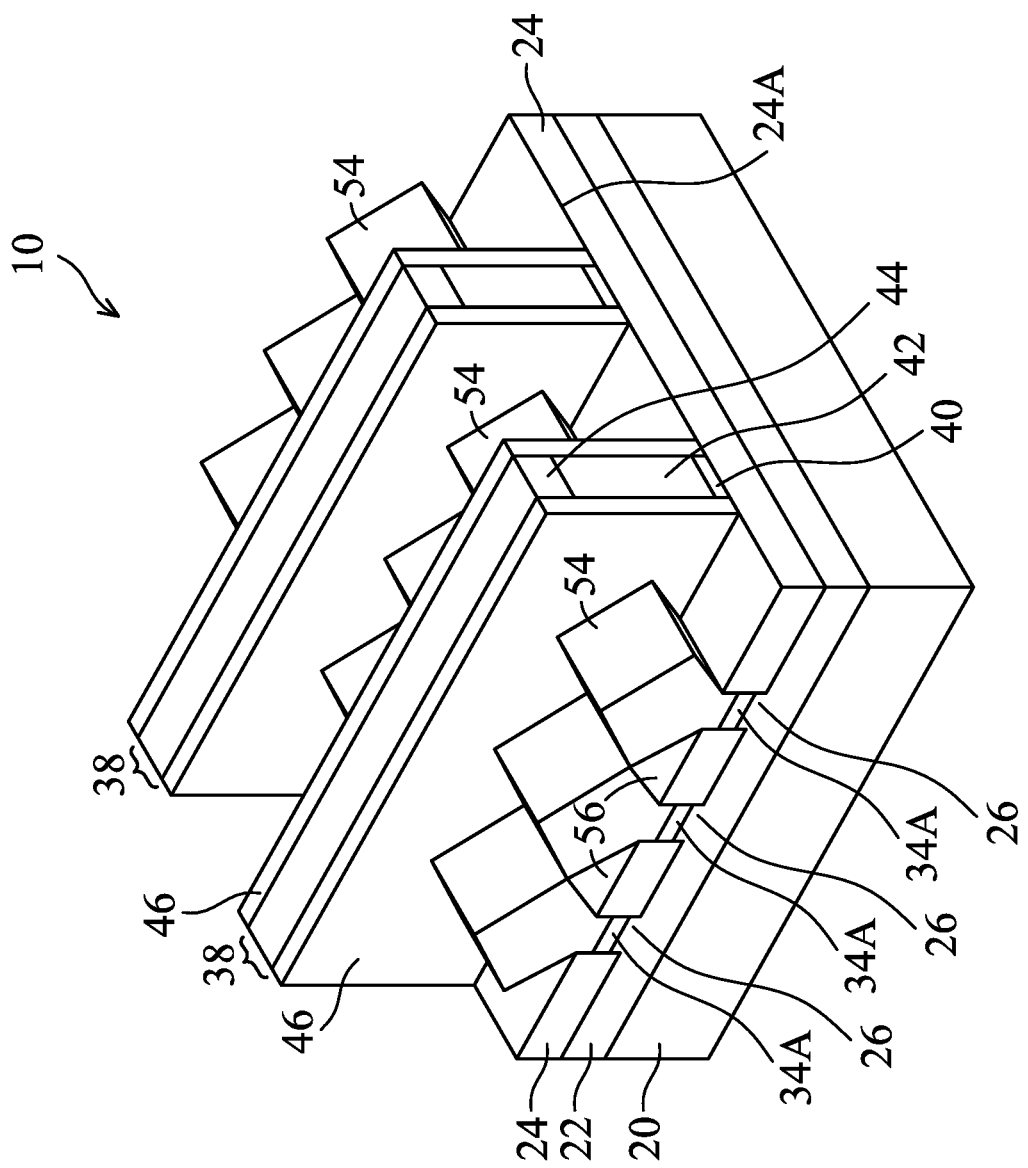
Figure 9:
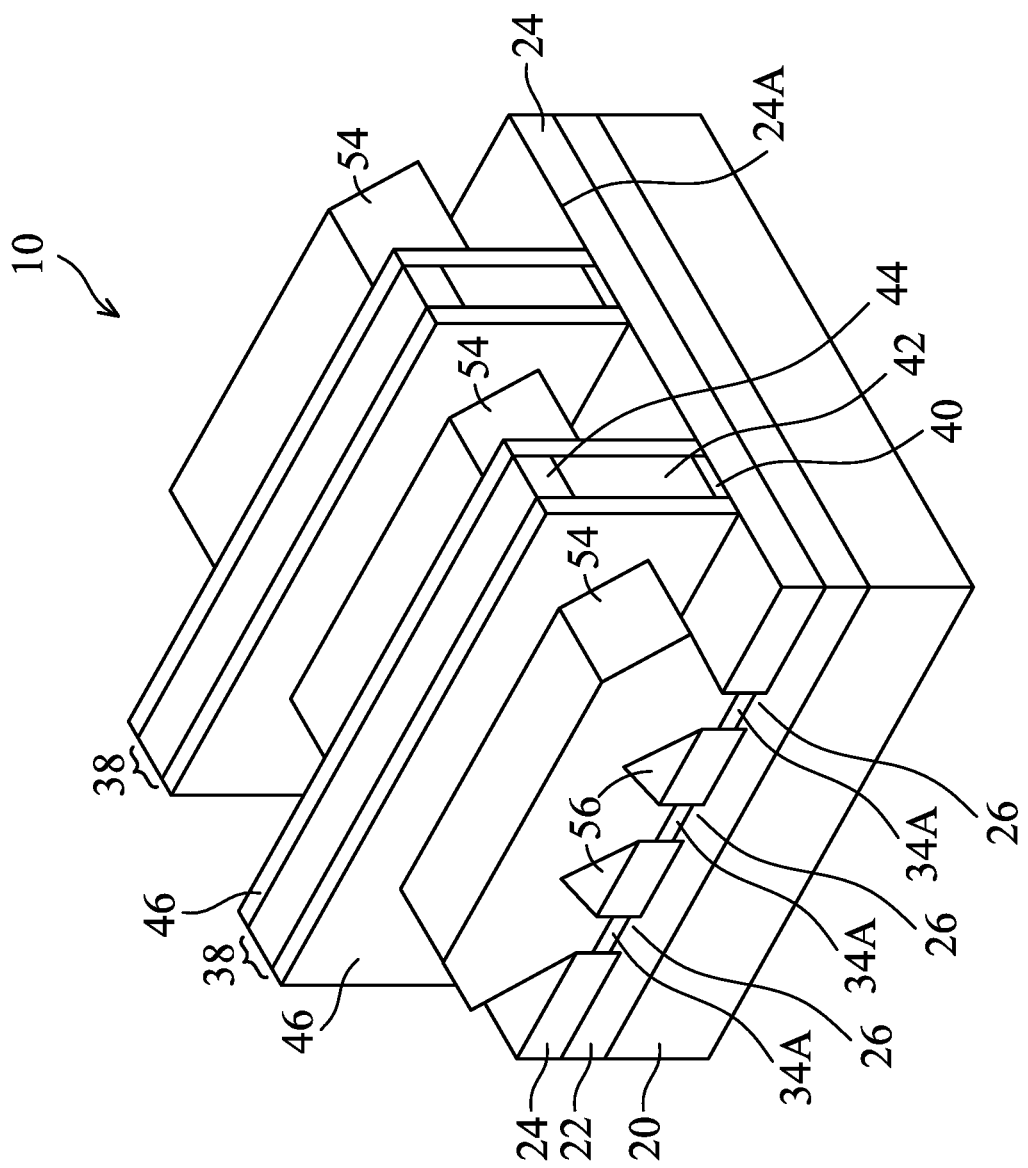

Next, an epitaxy process is performed to form epitaxy regions 54, which are selectively grown from recesses 50, resulting in the structure in FIG. 8. The respective process is illustrated as process 216 in the process flow shown in FIG. 13. In accordance with some embodiments, epitaxy regions 54 include SiP, SiCP, SiC, or the like, which may have a lattice constant smaller than that of silicon. In accordance with some embodiments of the present disclosure, an n-type impurity such as phosphorous, indium, antimony, or the like is in-situ doped into epitaxy regions 54 with the proceeding of the epitaxy. After epitaxy regions 54 fully fill recesses 50, epitaxy regions 54 start expanding horizontally, and facets may be formed. The neighboring epitaxy regions 54 start merging with each other. As a result, an integrated epitaxy region 54 is formed. The top surface of source/drain regions 54 may be higher than the bottom surfaces of gate spacers 46.

Voids (air gaps) 56 may be generated. In accordance with some embodiments of the present disclosure, the formation of epitaxy regions 54 is finished when the top surfaces of epitaxy regions 54 are still wavy (FIG. 8), or when the top surfaces of the merged epitaxy regions 54 have become planar (FIG. 9), which is achieved by further growing on the epitaxy regions 54 as shown in FIG. 8. After the formation of epitaxy regions 54, an implantation process may be performed to implant an n-type impurity into epitaxy regions 54, forming source/drain regions, which are also denoted as source/drain regions 54. In accordance with alternative embodiments in which an n-type impurity has been in-situ incorporated, the implantation process is skipped.

Figure 10A:
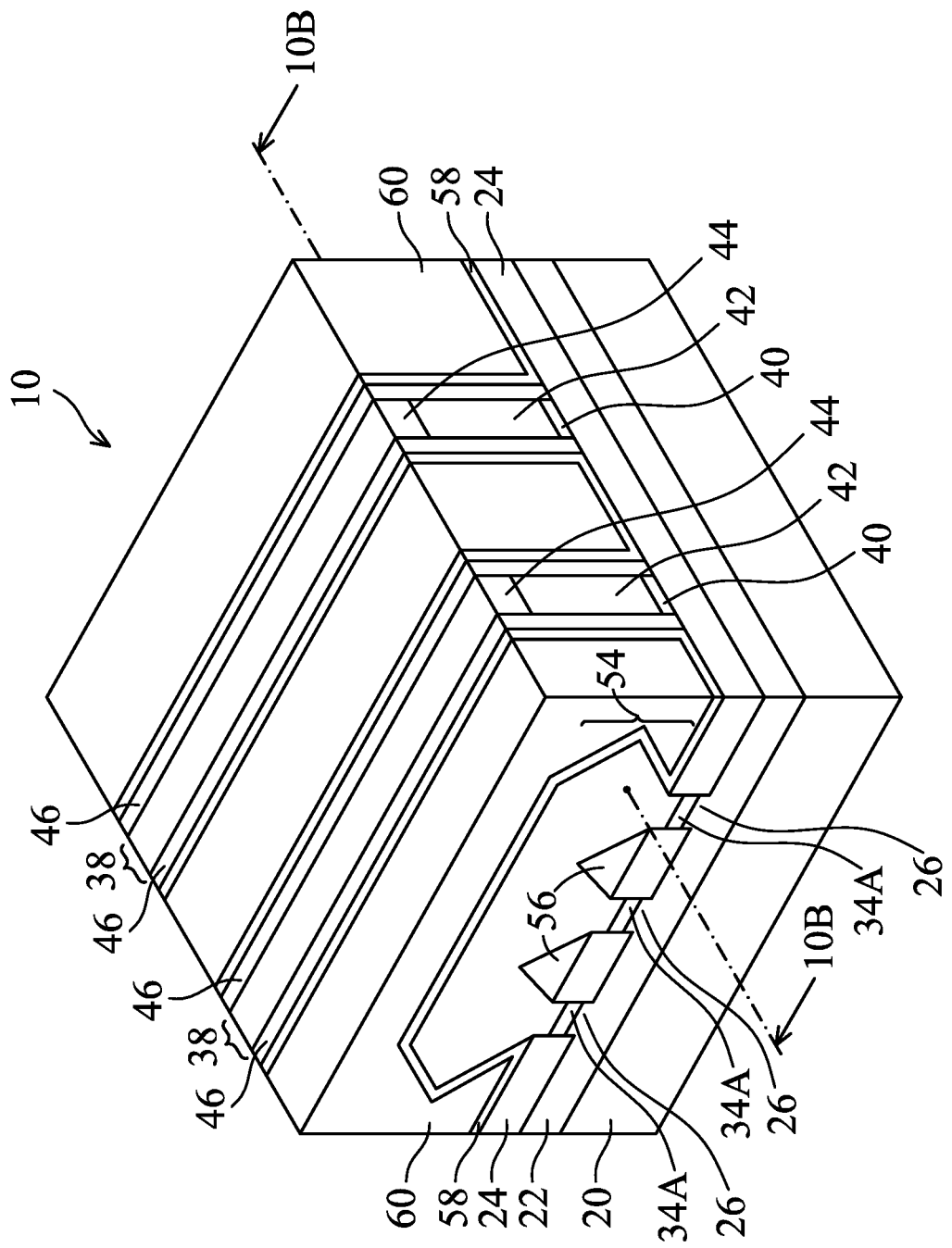

FIG. 10A illustrates a perspective view of the structure after the formation of Contact Etch Stop Layer (CESL) 58 and Inter-Layer Dielectric (ILD) 60. The respective process is illustrated as process 218 in the process flow shown in FIG. 13. CESL 58 may be formed of silicon oxide, silicon nitride, silicon carbo-nitride, or the like, and may be formed using CVD, ALD, or the like. ILD 60 may include a dielectric material formed using, for example, FCVD, spin-on coating, CVD, or another deposition method. ILD 60 may be formed of an oxygen-containing dielectric material, which may be a silicon-oxide based material such as Tetra Ethyl Ortho Silicate (TEOS) oxide, Plasma-Enhanced CVD (PECVD) oxide ($SiO_2$), Phospho-Silicate Glass (PSG), Boro-Silicate Glass (BSG), Boron-Doped Phospho-Silicate Glass (BPSG), or the like. A planarization process such as a CMP process or a mechanical grinding process may be performed to level the top surfaces of ILD 60, dummy gate stacks 38, and gate spacers 46 with each other.

Figure 10B:
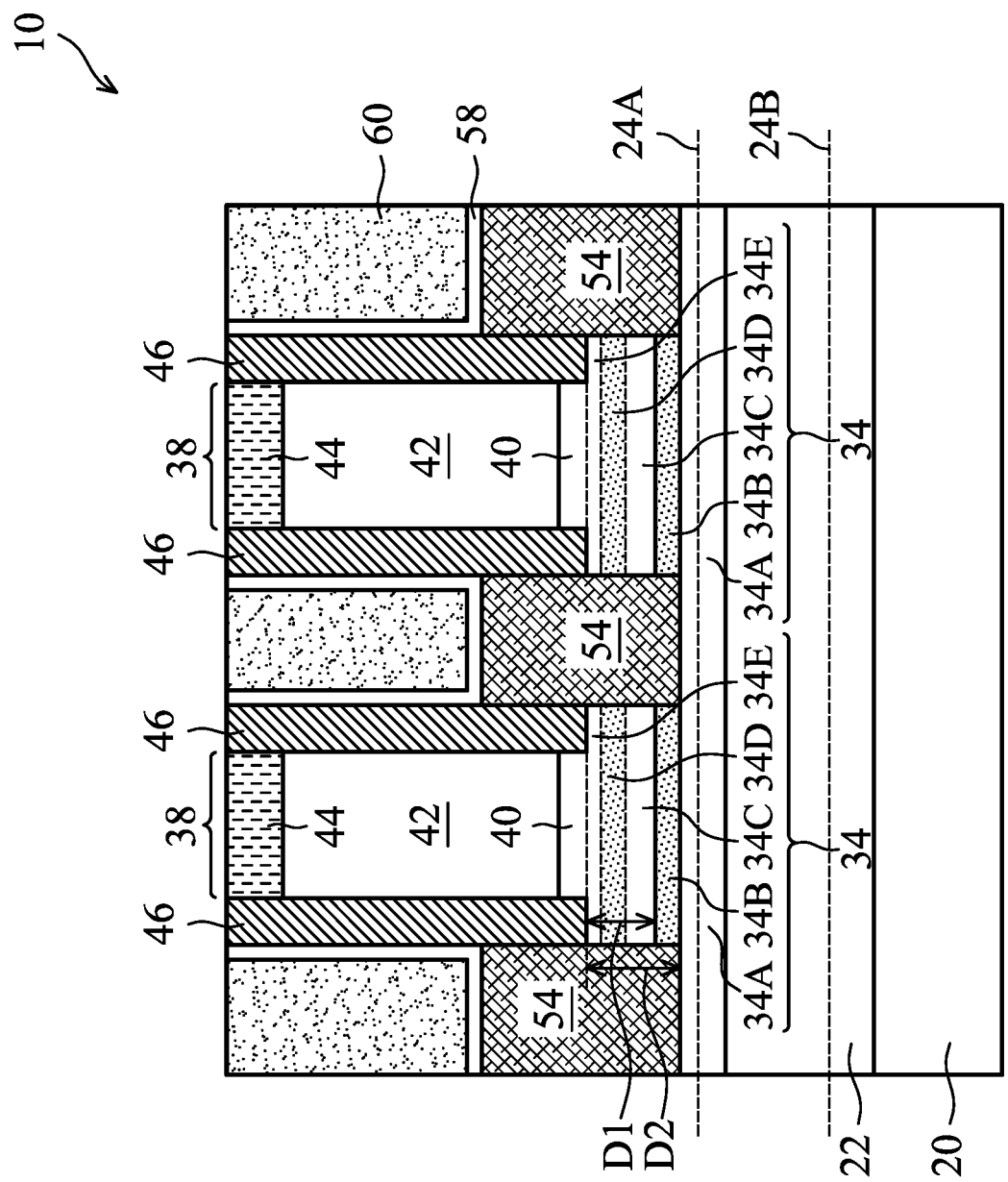

FIG. 10B illustrates the reference cross-section 10B-10B in FIG. 10A. As shown in FIG. 10B, source/drain regions 54 are at least in contact with p-type semiconductor layer 34B. For example, depending on whether source/drain regions 54 penetrate through p-type semiconductor layer 34B or not, source/drain regions 54 may be in contact with the top surface and/or the sidewall of p-type epitaxy semiconductor layer 34B. Source/drain regions 54 are also in contact with the sidewalls of silicon layer 34C, and may be in contact with the sidewalls of p-type epitaxy semiconductor layer 34D and silicon layer 34E, if formed. Source/drain regions 54 may be in contact with, and may or may not extend into, silicon layer 34A. When source/drain regions 54 extend into silicon layer 34A, source/drain regions 54 may not penetrate through silicon layer 34A.

In accordance with some embodiments, p-type semiconductor layer 34B is close to the bottom of source/drain regions 54. For example, the depth D1 of the top surface of p-type semiconductor layer 34B may be greater than about 80 percent the depth D2 of source/drain regions 54, wherein depths D1 and D2 are measured from the bottom of gate spacers 46. Ratio D1/D2 may be up to 100 percent, which means that the bottom surface of source/drain regions 54 are in contact with the top surface of p-type semiconductor layer 34B. Allocating p-type epitaxy semiconductor layer 34B close to the bottom of source/drain regions 54 has more effect in improving Drain-Induced Barrier Lowering (DIBL) performance of the respective transistor than allocating p-type epitaxy semiconductor layer 34B to a higher position.

Next, dummy gate stacks 38, which include hard mask layers 44, dummy gate electrodes 42, and dummy gate dielectrics 40, are replaced with replacement gate stacks 68 (FIG. 11), which include metal gates 66 and gate dielectrics 64. The respective process is illustrated as process 220 in the process flow shown in FIG. 13. When forming replacement gate stacks 68, hard mask layers 44, dummy gate electrodes 42, and dummy gate dielectrics 40 as shown in FIGS. 10A and 10B are first removed in one or a plurality of etching steps, resulting in trenches/openings to be formed between gate spacers 46. The top surfaces and the sidewalls of protruding semiconductor fins 36 are exposed to the resulting trenches.

As revealed in FIG. 10B, after dummy gate stacks 38 are exposed, stacked semiconductor layers 34 are exposed to the resulting trenches. In some cases, the removal of dummy gate stacks 38 may not stop on the top surface of the top silicon layer (34E (if formed), or 34C if 34E and 34D are not formed) well. If this occurs, the resulting recess in semiconductor layers 34 may laterally extend toward source/drain regions 54, and there is a possibility the subsequently formed gate electrodes 66 may be electrically shorted to source/drain regions 54, or have high leakage currents therebetween. This effect is referred to as metal gate extrusion, which may cause device failure. P-type epitaxy semiconductor layer 34D, which is formed close to the top surface of stacked semiconductor layers 34, may act as the etch stop layer if silicon layer 34E is etched-through since the etching rate of p-type epitaxy semiconductor layer 34D is lower than the etching rate of silicon layer 34E when an appropriate etchant is used.

After the removal of dummy gate stacks 38, (replacement) gate dielectric layers 64 are formed, which extend into the trenches between gate spacers 46. In accordance with some embodiments of the present disclosure, each of gate dielectric layers 64 includes an Interfacial Layer (IL) as its lower part, which contacts the exposed surfaces of the corresponding protruding fins 36. The IL may include an oxide layer such as a silicon oxide layer, which is formed through the thermal oxidation of protruding fins 36, a chemical oxidation process, or a deposition process. Gate dielectric layer 64 may also include a high-k dielectric layer formed over the IL. The high-k dielectric layer may include a high-k dielectric material such as hafnium oxide, lanthanum oxide, aluminum oxide, zirconium oxide, silicon nitride, or the like. The dielectric constant (k-value) of the high-k dielectric material is higher than 3.9, and may be higher than about 7.0. The high-k dielectric layer is formed as a conformal layer, and extends on the sidewalls of protruding fins 36 and the sidewalls of gate spacers 46. In accordance with some embodiments of the present disclosure, the high-k dielectric layer is formed using ALD or CVD.

Figure 11:
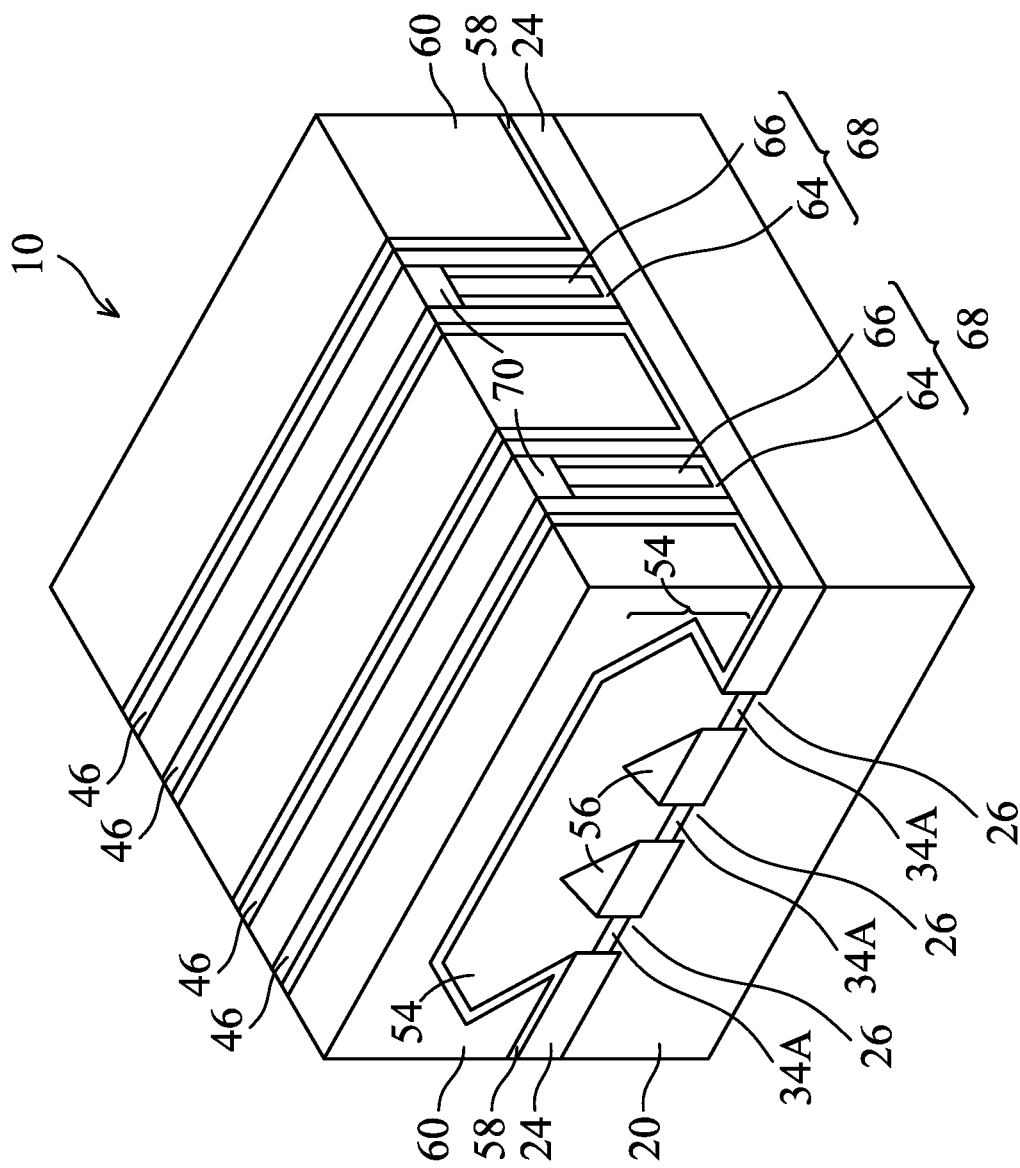

Referring further to FIG. 11, gate electrodes 66 are formed over gate dielectrics 64. Gate electrodes 66 include conductive sub-layers. The sub-layers are not shown separately, while the sub-layers are distinguishable from each other. The deposition of the sub-layers may be performed using a conformal deposition method(s) such as ALD or CVD.

The stacked conductive layers may include a diffusion barrier layer and one (or more) work-function layer over the diffusion barrier layer. The diffusion barrier layer may be formed of titanium nitride (TiN), which may (or may not) be doped with silicon. The work-function layer (marked schematically as 66A in FIG. 12B) determines the work function of the gate, and includes at least one layer, or a plurality of layers formed of different materials. For example, the work-function layer 66A may include a titanium aluminum (TiAl) layer. After the deposition of the work-function layer(s), a barrier layer, which may be another TiN layer, is formed.

The deposited gate dielectric layers and conductive layers are formed as conformal layers extending into the trenches between gate spacers 46, and include some portions over ILD 60. Next, a metallic material is deposited to fill the remaining trenches between gate spacers 46. The metallic material may be formed of tungsten or cobalt, for example. In a subsequent step, a planarization step such as a CMP process or a mechanical grinding process is performed, so that the portions of the gate dielectric layers, conductive sub-layers, and the metallic material over ILD 60 are removed. As a result, metal gate electrodes 66 and gate dielectrics 64 are formed. Gate electrodes 66 and gate dielectrics 64 are in combination referred to as replacement gate stacks 68. The top surfaces of replacement gate stacks 68, gate spacers 46, CESL 58, and ILD 60 may be substantially coplanar at this time.

FIG. 11 also illustrates the formation of hard masks 70 in accordance with some embodiments. The formation of hard masks 70 may include performing an etching step to recess gate stacks 68, so that recesses are formed between gate spacers 46, filling the recesses with a dielectric material, and then performing a planarization process such as a CMP process or a mechanical grinding process to remove excess portions of the dielectric material. Hard masks 70 may be formed of silicon nitride, silicon oxynitride, silicon oxycarbo-nitride, or the like.

Figure 12A:
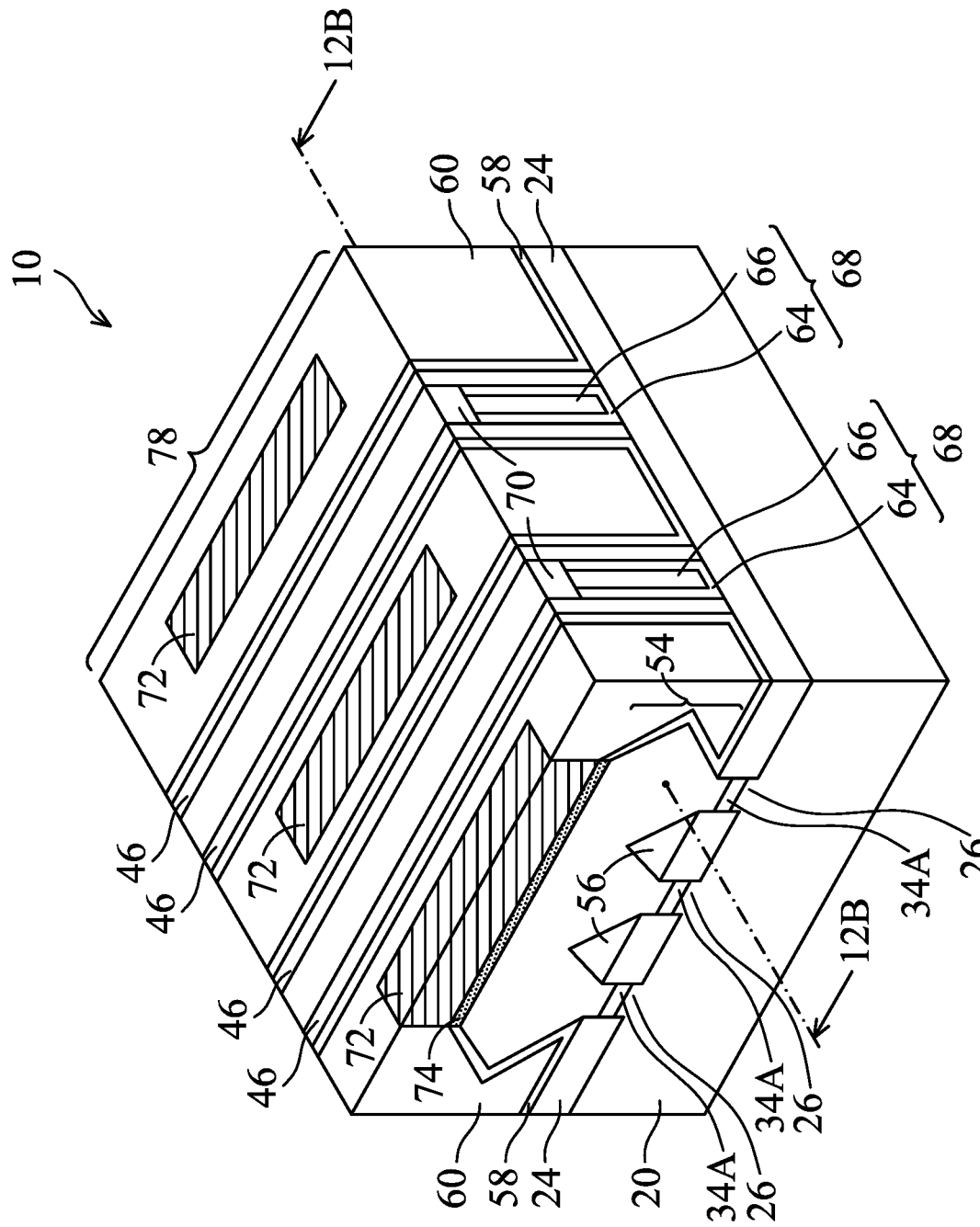
Figure 12B:
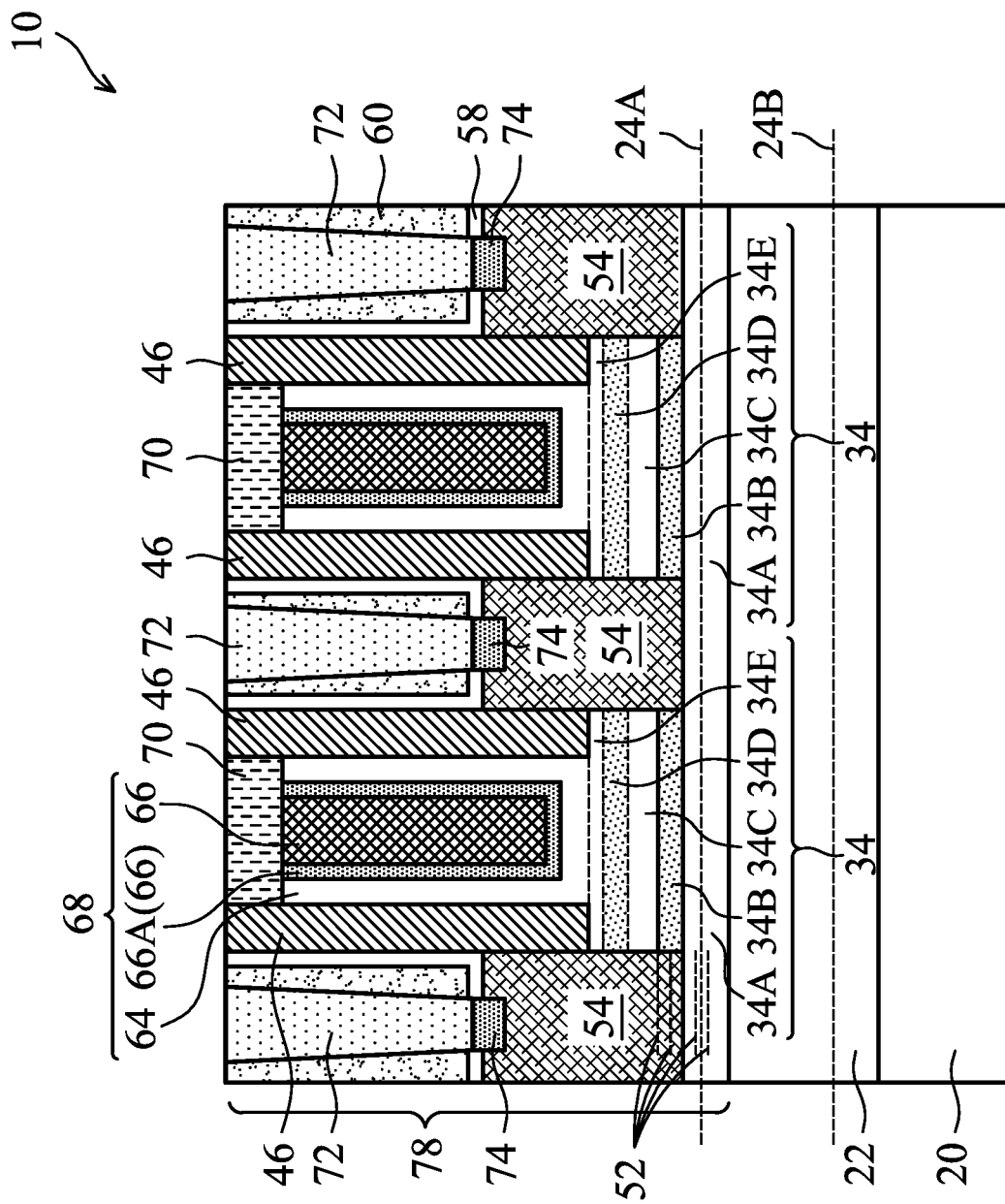
Figure 13:
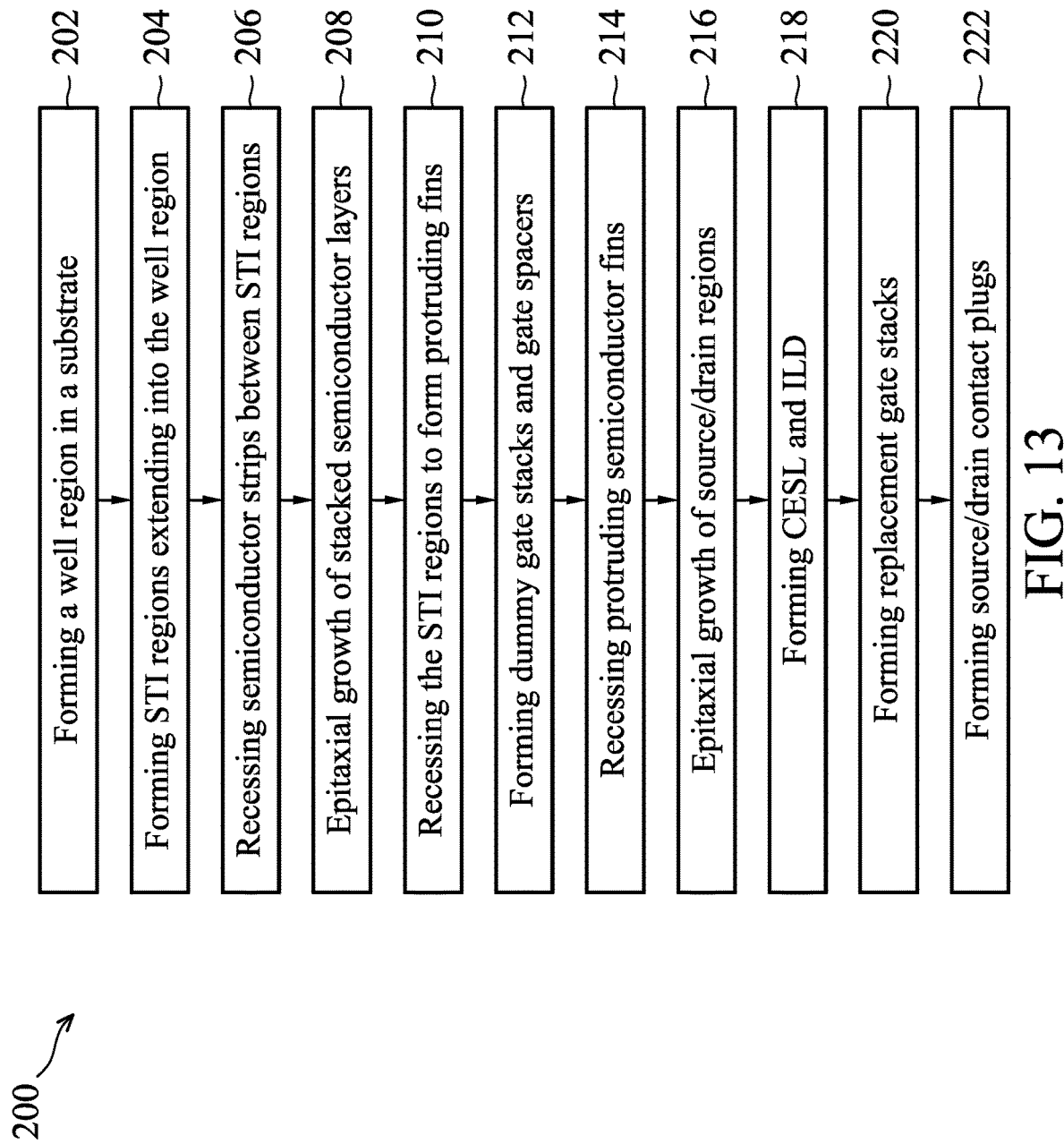
FIG. 13 illustrates a process flow for forming a transistor in accordance with some embodiments.

FIG. 12A illustrates the formation of source/drain contact plugs 72. The respective process is illustrated as process 222 in the process flow shown in FIG. 13. The formation of source/drain contact plugs 72 includes etching ILD 60 to expose the underlying portions of CESL 58, and then etching the exposed portions of CESL 58 to reveal epitaxy regions 54. In a subsequent process, a metal layer (such as a Ti layer) is deposited and extending into the contact openings. A metal nitride capping layer may be formed. An anneal process is then performed to react the metal layer with the top portion of source/drain regions 54 to form silicide regions 74, as shown in FIGS. 12A and 12B. Next, either the previously formed metal nitride layer is left as not removed, or the previously formed metal nitride layer is removed, followed by the deposition of a new metal nitride layer (such as titanium nitride layer). A filling metallic material such as tungsten, cobalt, or the like, is then filled into the contact openings, followed by a planarization to remove excess materials, resulting in source/drain contact plug 72. Accordingly, source/drain contact plug 72 includes the remaining portions of the metal layer, metal nitride layer, and the filling metallic material. Gate contact plugs (not) shown) are also formed to penetrate through a portion of each of hard masks 70 to contact gate electrodes 66. FinFETs 78, which may be connected in parallel as one FinFET, is thus formed.

FIG. 12B illustrates the reference cross-section 12B-12B in FIG. 12A. As shown in FIG. 12B, gate stacks 68 are over the stacked semiconductor layers 34, which act as the channels of FinFET 78. Currents may flow in stacked semiconductor layers 34, and may flow in both p-type epitaxy semiconductor layers (34B/34D) and silicon layers (34A/34C/34E). Gate stacks 68 may be in contact with silicon layer 34C, p-type epitaxy semiconductor layer 34D, or silicon layer 34E, depending on whether p-type epitaxy semiconductor layer 34D and silicon layer 34E are formed or not.

The embodiments of the present disclosure have some advantageous features. By forming a p-type epitaxy semiconductor layer at a level close to the bottom level of source/drain regions, the leaked electrons leaking between source and drain regions can recombine with the holes of the p-type epitaxy semiconductor layer, so that the leakage is reduced, and the DIBL performance is improved. By forming a p-type epitaxy semiconductor layer at a level close to the top level of source/drain regions, the p-type epitaxy semiconductor layer may act as an etch stop layer, and has the function of preventing metal gate extrusion. The production yield is improved.

In accordance with some embodiments of the present disclosure, a method of forming a semiconductor device comprises depositing a first p-type semiconductor layer over a portion of a semiconductor substrate; depositing a first semiconductor layer over the first p-type semiconductor layer, wherein the first semiconductor layer is free from p-type impurities; forming a gate stack directly over a first portion of the first semiconductor layer; etching a second portion of the first semiconductor layer to form a trench extending into the first semiconductor layer, wherein at least a surface of the first p-type semiconductor layer is exposed to the trench; and forming a source/drain region in the trench, wherein the source/drain region is of n-type. In an embodiment, the method further comprises depositing a second semiconductor layer over the portion of a semiconductor substrate, wherein the second semiconductor layer is further free from p-type impurities, and the second semiconductor layer is underlying and in contact with the first p-type semiconductor layer. In an embodiment, in the etching, the first p-type semiconductor layer is further etched-through, and a top surface of the second semiconductor layer is exposed to the trench. In an embodiment, a bottom surface of the trench is higher than a bottom surface of the second semiconductor layer. In an embodiment, the etching stops on a top surface of the first p-type semiconductor layer. In an embodiment, the method further comprises depositing a second p-type semiconductor layer over the first semiconductor layer. In an embodiment, the method further comprises depositing a second semiconductor layer over the second p-type semiconductor layer, wherein the second semiconductor layer is free from p-type impurities. In an embodiment, the method further comprises forming a gate electric over and contacting the second semiconductor layer. In an embodiment, the method further comprises etching a dummy gate stack over the second semiconductor layer, wherein the second semiconductor layer is etched-through, and the etching stops on a top surface of the second p-type semiconductor layer. In an embodiment, the first p-type semiconductor layer is further free from n-type impurities.

In accordance with some embodiments of the present disclosure, a method of forming a semiconductor device includes forming isolation regions extending into a semiconductor substrate; etching to remove a portion of the semiconductor substrate between the isolation regions to form a trench; performing a first epitaxy to grow a first semiconductor layer in the trench, wherein the first semiconductor layer is free from p-type impurities and n-type impurities; performing a second epitaxy to grow a first SiB layer over and contacting the first semiconductor layer; performing a third epitaxy to grow a second semiconductor layer over the first SiB layer, wherein the second semiconductor layer is free from p-type impurities and n-type impurities; and recessing the isolation regions, so that the second semiconductor layer and a portion of the first SiB layer are higher than top surfaces of the isolation regions to form a semiconductor fin. In an embodiment, in the recessing the isolation regions, a first portion of the first semiconductor layer is higher than the top surfaces of the isolation regions to form a portion of a semiconductor fin. In an embodiment, in the recessing the isolation regions, a second portion of the first semiconductor layer is lower than the top surfaces of the isolation regions. In an embodiment, the method further comprises forming a gate stack overlapping a first portion of the first semiconductor layer; performing an etching process using the gate stack as a part of an etching mask to form a trench, wherein in the etching process, the second semiconductor layer is etched-through, and a surface of the first SiB layer is exposed to the trench; and forming a source/drain region in the trench, wherein the source/drain region is of n-type. In an embodiment, the method further comprises performing a fourth epitaxy to grow a second SiB layer over the second semiconductor layer; and performing a fifth epitaxy to grow a third semiconductor layer over the second SiB layer, wherein the third semiconductor layer is free from p-type impurities and n-type impurities.

In accordance with some embodiments of the present disclosure, a semiconductor device comprises isolation regions extending into a semiconductor substrate; a semiconductor fin between the isolation regions, wherein the semiconductor fin is higher than top surfaces of the isolation regions, and the semiconductor fin comprises a first semiconductor layer, the first semiconductor layer being free from p-type impurities; and a first p-type semiconductor layer over and contacting the first semiconductor layer; a gate stack on the semiconductor fin; and a source/drain region extending into the semiconductor fin, wherein the source/drain region contacts the first p-type semiconductor layer, and the source/drain region is an n-type region. In an embodiment, the source/drain region comprises a bottom surface contacting a top surface of the first p-type semiconductor layer. In an embodiment, the source/drain region penetrates through the first p-type semiconductor layer, and the source/drain region contacts a sidewall of the first p-type semiconductor layer. In an embodiment, the semiconductor fin further comprises a second semiconductor layer over and contacting the first p-type semiconductor layer, the second semiconductor layer being free from p-type impurities and n-type impurities. In an embodiment, the semiconductor fin further comprises a second p-type semiconductor layer over and contacting the second semiconductor layer; and a third semiconductor layer over and contacting the second p-type semiconductor layer, the third semiconductor layer being free from p-type impurities and n-type impurities.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a bulk semiconductor substrate;
   a semiconductor stack comprising:
      a first semiconductor layer and a second semiconductor layer over the bulk semiconductor substrate, wherein the first semiconductor layer and the second semiconductor layer have first p-type impurity concentrations; and
      a third semiconductor layer, wherein the third semiconductor layer is between and physically contacting the first semiconductor layer and the second semiconductor layer, wherein a second p-type impurity concentration in the third semiconductor layer is lower than the first p-type impurity concentrations;
   a gate stack on the semiconductor stack; and
   a source/drain region on a side of, and contacting the semiconductor stack.

2. The device of claim 1, wherein the second p-type impurity concentration in the third semiconductor layer is at least one order lower than the first p-type impurity concentrations.

3. The device of claim 2, wherein the second p-type impurity concentration in the third semiconductor layer is at least two orders lower than the first p-type impurity concentrations.

4. The device of claim 1, wherein the source/drain region is an n-type region.

5. The device of claim 1 further comprising:
   dielectric isolation regions over the bulk semiconductor substrate, wherein the semiconductor stack is between opposing portions of the dielectric isolation regions, and wherein a top portion of the semiconductor stack is higher than top surfaces of the dielectric isolation regions.

6. The device of claim 1, wherein the semiconductor stack further comprises:
   a fourth semiconductor layer over the first semiconductor layer, the second semiconductor layer, and the third semiconductor layer, wherein a third p-type impurity concentration in the fourth semiconductor layer is lower than the first p-type impurity concentrations.

7. The device of claim 6, wherein the gate stack physically contacts a top surface of the fourth semiconductor layer.

8. A semiconductor device comprising:
   a bulk semiconductor substrate;
   a first plurality of semiconductor layers over the bulk semiconductor substrate, wherein the first plurality of semiconductor layers have first p-type impurity concentrations;
   a second plurality of semiconductor layers, wherein the first plurality of semiconductor layers and the second plurality of semiconductor layers form a stack of layers, and are allocated alternatingly, wherein each of the second plurality of semiconductor layers has a second p-type impurity concentration greater than the first p-type impurity concentrations of an immediate overlying one and an immediate underlying one of the second plurality of semiconductor layers;
   a gate stack on a top surface and sidewalls of the stack of layers; and
   a source/drain region on a side of, and contacting the stack of layers.

9. The semiconductor device of claim 8, wherein the second p-type impurity concentration of each of the second plurality of semiconductor layers is greater than the first p-type impurity concentration of each of the first plurality of semiconductor layers.

10. The semiconductor device of claim 8, wherein the second p-type impurity concentration of each of the second plurality of semiconductor layers is greater than the first p-type impurity concentrations of an immediate overlying one and an immediate underlying one of the first plurality of semiconductor layers by at least one order.

11. The semiconductor device of claim 8, wherein the source/drain region is n-type.

12. The semiconductor device of claim 8, wherein the source/drain region has a sidewall contacting at least one of the first plurality of semiconductor layers and one of the second plurality of semiconductor layers to form vertical interfaces.

13. A semiconductor device comprising:
   isolation regions extending into a semiconductor substrate;
   a semiconductor region between the isolation regions, wherein a first top surface of the semiconductor region is higher than second top surfaces of the isolation regions, and the semiconductor region comprises:
      a first intrinsic semiconductor layer, the first intrinsic semiconductor layer being free from p-type impurities; and
      a first p-type semiconductor layer over and contacting the first intrinsic semiconductor layer;
   a gate stack on the semiconductor region; and
   a source/drain region extending into the semiconductor region, wherein the source/drain region contacts the first p-type semiconductor layer, and the source/drain region is an n-type region.

14. The semiconductor device of claim 13, wherein an entirety of the source/drain region is higher than the first p-type semiconductor layer.

15. The semiconductor device of claim 13, wherein the source/drain region extends into the first p-type semiconductor layer, and the source/drain region comprises a bottom surface spaced apart from a top surface of the first intrinsic semiconductor layer by a portion of the first p-type semiconductor layer.

16. The semiconductor device of claim 13, wherein the source/drain region comprises a bottom surface contacting a top surface of the first intrinsic semiconductor layer.

17. The semiconductor device of claim 16, wherein the source/drain region extends into, and contacts a sidewall of, the first intrinsic semiconductor layer.

18. The semiconductor device of claim 13, wherein the semiconductor region further comprises a second intrinsic semiconductor layer over and contacting the first p-type semiconductor layer.

19. The semiconductor device of claim 18, wherein the semiconductor region further comprises:
   a second p-type semiconductor layer over and contacting the second intrinsic semiconductor layer; and
   a third intrinsic semiconductor layer over and contacting the second p-type semiconductor layer.

20. The semiconductor device of claim 13, wherein the gate stack contacts sidewalls of a top portion of the semiconductor region.

\* \* \* \* \*